(12) United States Patent
Lee

(10) Patent No.: US 12,087,804 B2
(45) Date of Patent: Sep. 10, 2024

(54) LIGHT EMITTING DEVICE

(71) Applicant: SEOUL VIOSYS CO., LTD., Ansan-si (KR)

(72) Inventor: Chung Hoon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 427 days.

(21) Appl. No.: 17/471,836

(22) Filed: Sep. 10, 2021

(65) Prior Publication Data

US 2021/0408101 A1    Dec. 30, 2021

Related U.S. Application Data

(63) Continuation of application No. 16/670,293, filed on Oct. 31, 2019, now Pat. No. 11,158,665.

(Continued)

(51) Int. Cl.
*H01L 27/15* (2006.01)
*H01L 33/38* (2010.01)
(Continued)

(52) U.S. Cl.
CPC .......... *H01L 27/15* (2013.01); *H01L 33/382* (2013.01); *H01L 33/44* (2013.01); *H01L 33/505* (2013.01); *H01L 33/58* (2013.01); *H01L 33/62* (2013.01); *H01L 2933/0016* (2013.01); *H01L 2933/0025* (2013.01); *H01L 2933/0066* (2013.01)

(58) Field of Classification Search
CPC ..... H01L 33/00–648; H01L 27/15–156; H01L 2933/00–0091; H01L 33/483–486; H01L 33/50–508; H01L 33/52–56; H01L 33/58–60; H01L 33/64–648
See application file for complete search history.

(56) References Cited

U.S. PATENT DOCUMENTS 5,696,389 A    12/1997   Ishikawa et al.
8,916,901 B2   12/2014   Kimura et al.
(Continued)

FOREIGN PATENT DOCUMENTS

CN    201134433    10/2008
CN    102593303    7/2012
(Continued)

OTHER PUBLICATIONS

International Search Report issued Feb. 18, 2020, in PCT/KR2019/014824 (with English Translation), 5 pages.
(Continued)

*Primary Examiner* — Mohammad A Rahman
(74) *Attorney, Agent, or Firm* — Oblon, McClelland, Maier & Neustadt, L.L.P.

(57) ABSTRACT

A light emitting device including a substrate having a first region and a second region, a light emitting stack including vertically stacked semiconductor layers disposed on the first region of the substrate, at least one pillar disposed on the second region of the substrate and laterally spaced apart from the light emitting stack, and at least one electrode extending from the first region to the second region of the substrate and electrically connecting the light emitting stack to the at least one pillar, in which the at least one pillar is disposed on the at least one electrode, respectively.

18 Claims, 22 Drawing Sheets

Related U.S. Application Data

(60) Provisional application No. 62/755,652, filed on Nov. 5, 2018.

(51) Int. Cl.
    *H01L 33/44*     (2010.01)
    *H01L 33/50*     (2010.01)
    *H01L 33/58*     (2010.01)
    *H01L 33/62*     (2010.01)

(56) References Cited

U.S. PATENT DOCUMENTS

| | | | |
|---|---|---|---|
| 9,923,032 B2 | 3/2018 | Lee et al. | |
| 10,686,099 B2 | 6/2020 | Huppmann et al. | |
| 10,748,881 B2 | 8/2020 | Kim et al. | |
| 10,892,296 B2 | 1/2021 | Chae et al. | |
| 2006/0027820 A1 | 2/2006 | Cao | |
| 2010/0012963 A1 | 1/2010 | Hwan et al. | |
| 2013/0126921 A1 | 5/2013 | Mohammed et al. | |
| 2014/0159091 A1* | 6/2014 | Hon | H01L 33/20 257/98 |
| 2017/0125631 A1* | 5/2017 | Lee | H01L 33/06 |
| 2017/0288093 A1 | 10/2017 | Cha et al. | |
| 2019/0016954 A1* | 1/2019 | Moon | C09K 11/0883 |
| 2019/0164944 A1 | 5/2019 | Chae et al. | |

FOREIGN PATENT DOCUMENTS

| | | |
|---|---|---|
| JP | 07-254732 | 10/1995 |
| JP | 2003-282957 | 10/2003 |
| JP | 2008-277176 | 11/2008 |
| JP | 2013-201273 | 10/2013 |
| JP | 2014-107307 | 6/2014 |
| JP | 2018-120959 | 8/2018 |
| KR | 10-2006-0023634 A | 3/2006 |
| KR | 10-2006-0081648 A | 7/2006 |
| KR | 10-2013-0137816 A | 12/2013 |
| KR | 10-2017-0042426 A | 4/2017 |
| WO | 2017153123 | 9/2017 |

OTHER PUBLICATIONS

International Preliminary Report on Patentability and Written Opinion issued in PCT/KR2019/014824 (English Translation only), 5 pages.

Japanese Office Action dated Jul. 4, 2023, in Japanese Patent Application No. 2021-522966 (with English translation).

Non-Final Office Action dated Jan. 29, 2021, issued to U.S. Appl. No. 16/670,293.

Notice of Allowance dated Jun. 11, 2021, issued to U.S. Appl. No. 16/670,293.

Extended European Search Report dated Jul. 1, 2022, issued in European Patent Application No. 19881618.3.

* cited by examiner

LIGHT EMITTING DEVICE

CROSS-REFERENCE TO RELATED APPLICATIONS

This application is a Continuation of U.S. patent application Ser. No. 16/670,293 which claims the benefit of U.S. Provisional Patent Application No. 62/755,652, filed on Nov. 5, 2018, each of which is hereby incorporated by reference for all purposes as if fully set forth herein.

BACKGROUND

Field

Exemplary embodiments of the invention relate generally to a light emitting device and, more specifically, to a light emitting device including a plurality of light emitting parts stacked one over another.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and faster response speed than existing light sources.

In general, a display device displays various colors by utilizing mixed colors of blue, green, and red. Each pixel of a display device includes blue, green, and red sub-pixels, the color of a particular pixel is determined through the colors of these sub-pixels, and an image is displayed by a combination of pixels.

Light emitting diodes have been mainly used as backlight sources in display devices. However, recently, a micro LED display has been developed as a next generation display, which directly displays images by using light emitting diodes.

The above information disclosed in this Background section is only for understanding of the background of the inventive concepts, and, therefore, it may contain information that does not constitute prior art.

SUMMARY

Devices constructed according to exemplary embodiments of the invention are capable of improving light efficiency and light extraction.

Additional features of the inventive concepts will be set forth in the description which follows, and in part will be apparent from the description, or may be learned by practice of the inventive concepts.

A light emitting device according to an exemplary embodiment includes a first light emitting part, a second light emitting part disposed over the first light emitting part, a third light emitting part disposed over the second light emitting part, a passivation layer surrounding outer sidewalls of the first, second, and third light emitting parts, a via pattern electrically coupled with at least one of the first, second, and third light emitting parts, and passing through at least a part of one of the first, second, and third light emitting parts, and a pad electrically coupled with the via pattern and overlapping the passivation layer.

The light emitting device may further include an extended pattern electrically coupled with the via pattern and extending from one surface of the third light emitting part to a side surface of the first light emitting part along side surfaces of the second and third light emitting parts, and a pillar pattern electrically coupling the extended pattern and the pad.

The light emitting device may further include a conductive pattern disposed between the via pattern and the extended pattern, and electrically coupling the via pattern and the extended pattern.

The light emitting device may further include a light shielding layer covering a portion of the first light emitting part to define a light extraction surface.

The light emitting device may further include a transparent adhesion part disposed over the light extraction surface defined by the light shielding layer.

Each of the first, second, and third light emitting parts may include a first-type semiconductor layer, an active layer, and a second-type semiconductor layer.

The via pattern may include a first via pattern passing through the second and third light emitting parts, and electrically coupled with the first-type semiconductor layer of the first light emitting part, a second via pattern passing through the third light emitting part, and electrically coupled with the first-type semiconductor layer of the second light emitting part, a third via pattern electrically coupled with the first-type semiconductor layer of the third light emitting part, a fourth via pattern passing through the second and third light emitting parts, and electrically coupled with the second-type semiconductor layer of the first light emitting part, a fifth via pattern passing through the third light emitting part, and electrically coupled with the second-type semiconductor layer of the second light emitting part, and a sixth via pattern electrically coupled with the second-type semiconductor layer of the third light emitting part.

The pad may include a first pad electrically coupled with the first via pattern, a second pad electrically coupled with the second via pattern, a third pad electrically coupled with the third via pattern, and a common pad electrically coupled with the fourth, fifth, and sixth via patterns in common.

The passivation layer may be disposed between adjacent light emitting devices.

The passivation layer may include at least one of epoxy resin, epoxy molding compound (EMC), and silicone.

A light emitting device according to another exemplary embodiment includes a first light emitting part, a second light emitting part disposed over the first light emitting part, a third light emitting part disposed over the second light emitting part and having a first surface and a second surface facing different directions, a first passivation layer surrounding outer sidewalls of the first, second, and third light emitting parts, a via pattern formed in at least one of the first, second, and third light emitting parts, an extended pattern at least partially disposed on each of the first and second surfaces of the third light emitting part, a second passivation layer disposed on the first passivation layer and the extended pattern, and a pad disposed on the second passivation layer and electrically coupled to the via pattern through the extended pattern.

The extended pattern may be disposed on each side wall of the first, second, and third light emitting parts.

At least a portion of the extended pattern may be disposed on the same plane as the first light emitting part.

The via pattern may be formed in plural, each being electrically connected to at least one of the first, second, and third light emitting parts, and the pad may be electrically connected to each of the plurality of via patterns.

The light emitting device may further include a substrate on which the first light emitting part is disposed, in which at least a portion of the extended pattern may be disposed on the substrate.

The light emitting device may further include a shielding layer disposed between the substrate and the first light emitting part to define a light emitting area.

The light emitting area may be smaller than an area of the substrate.

The light emitting area may be smaller than an area of the pad.

The pad may overlap each of a portion of the extended pattern disposed on the third light emitting part and a portion of the extended pattern disposed on the substrate.

The first passivation layer may be disposed between the portion of the extended pattern and the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
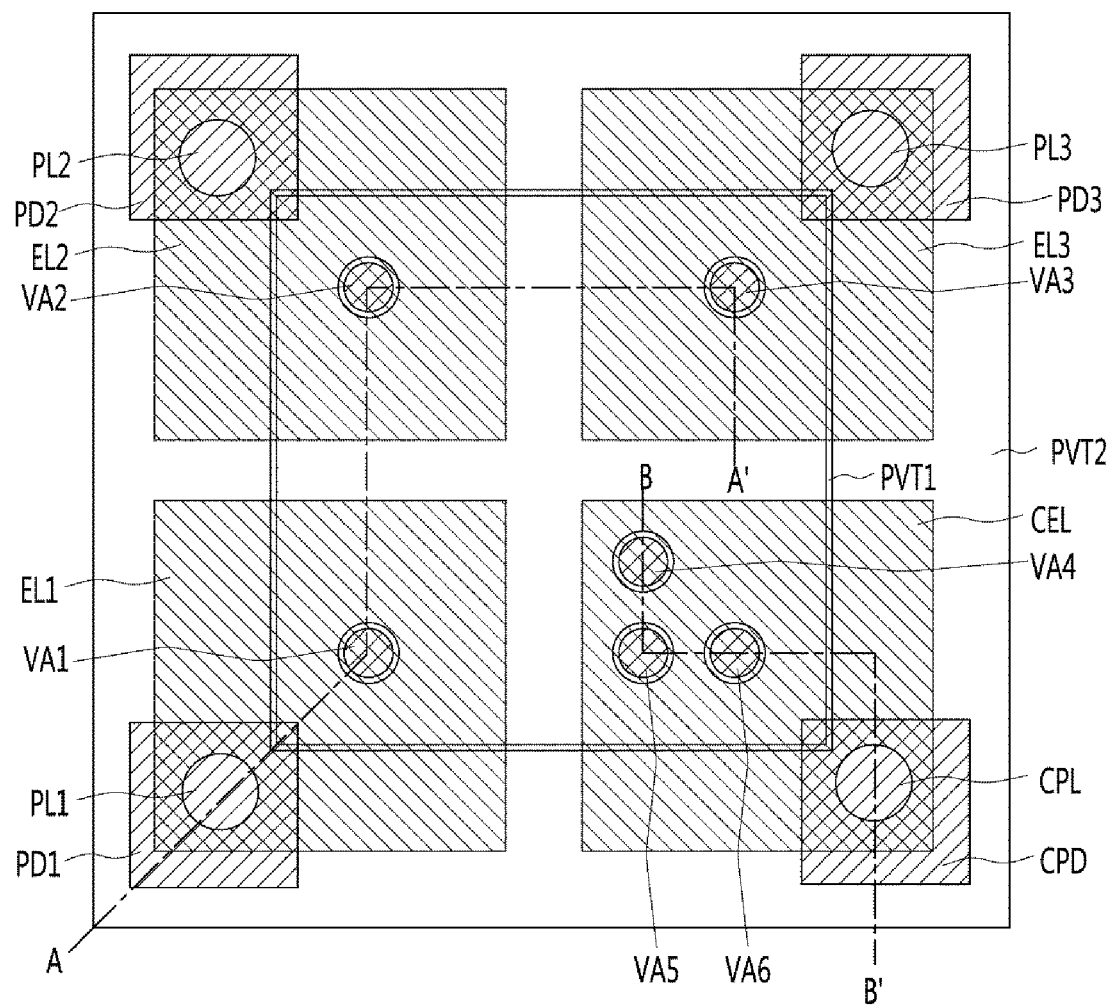
FIG. 1A is a top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
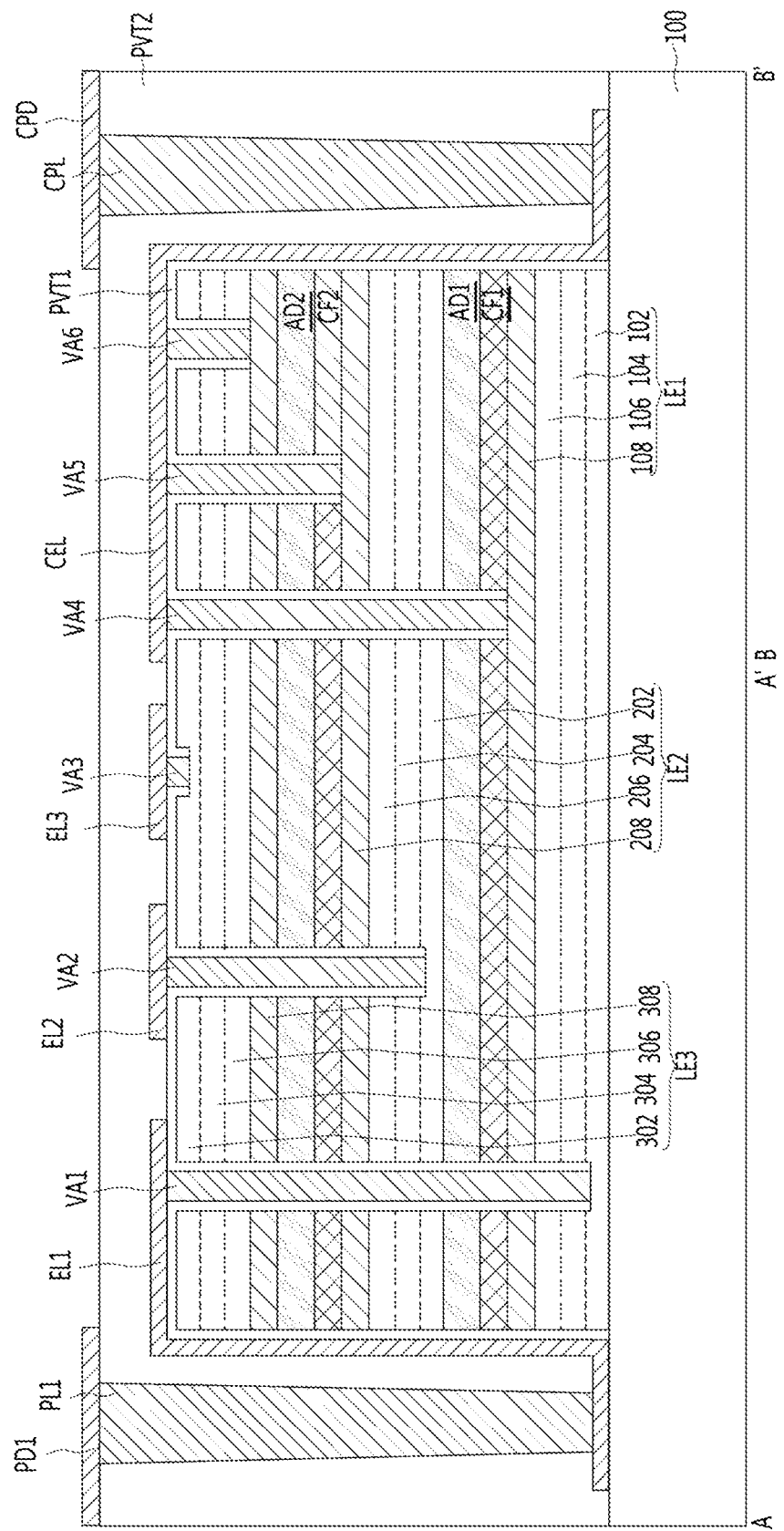
FIG. 1B is a cross-sectional view taken along lines A-A' and B-B' of FIG. 1A.
Figure 2A:
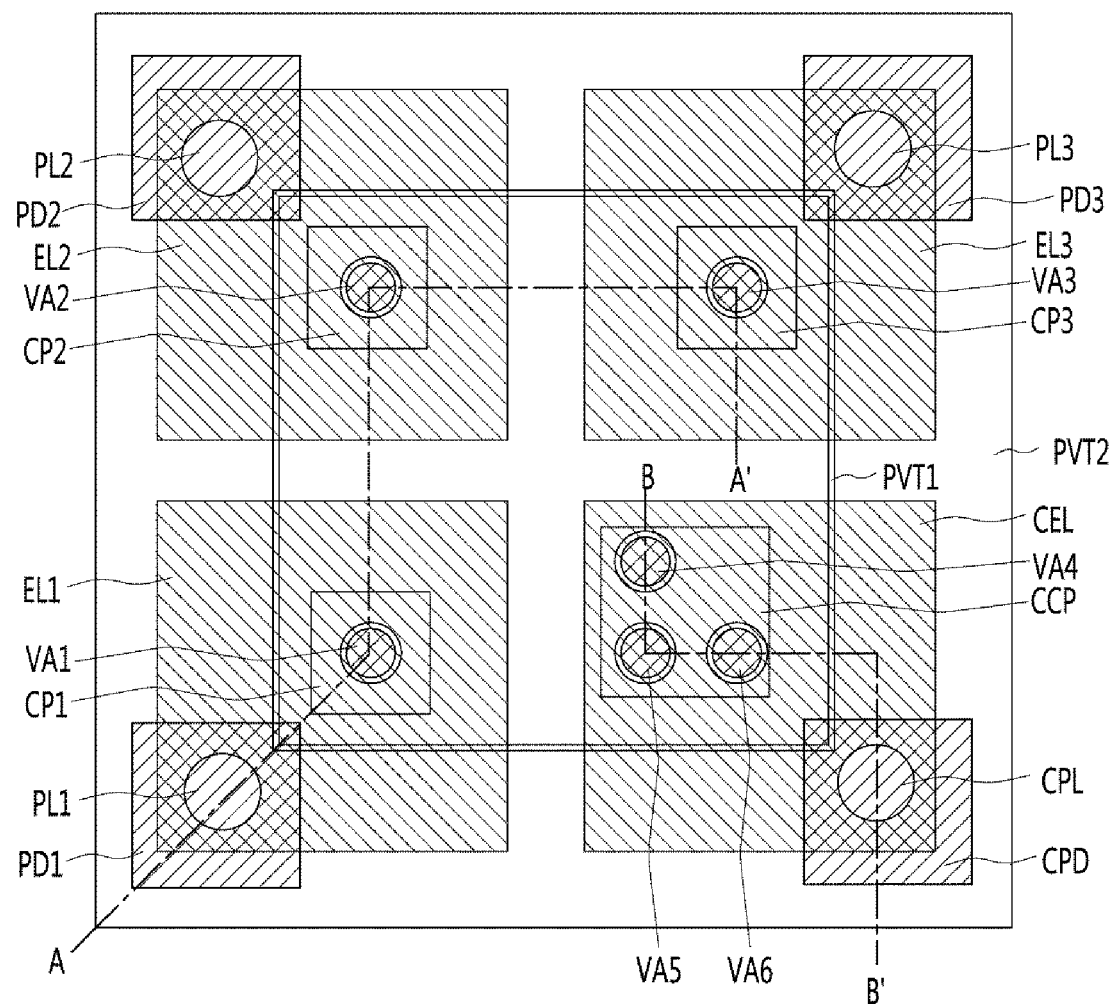
FIG. 2A is a top view of a light emitting device according to another exemplary embodiment.
Figure 2B:
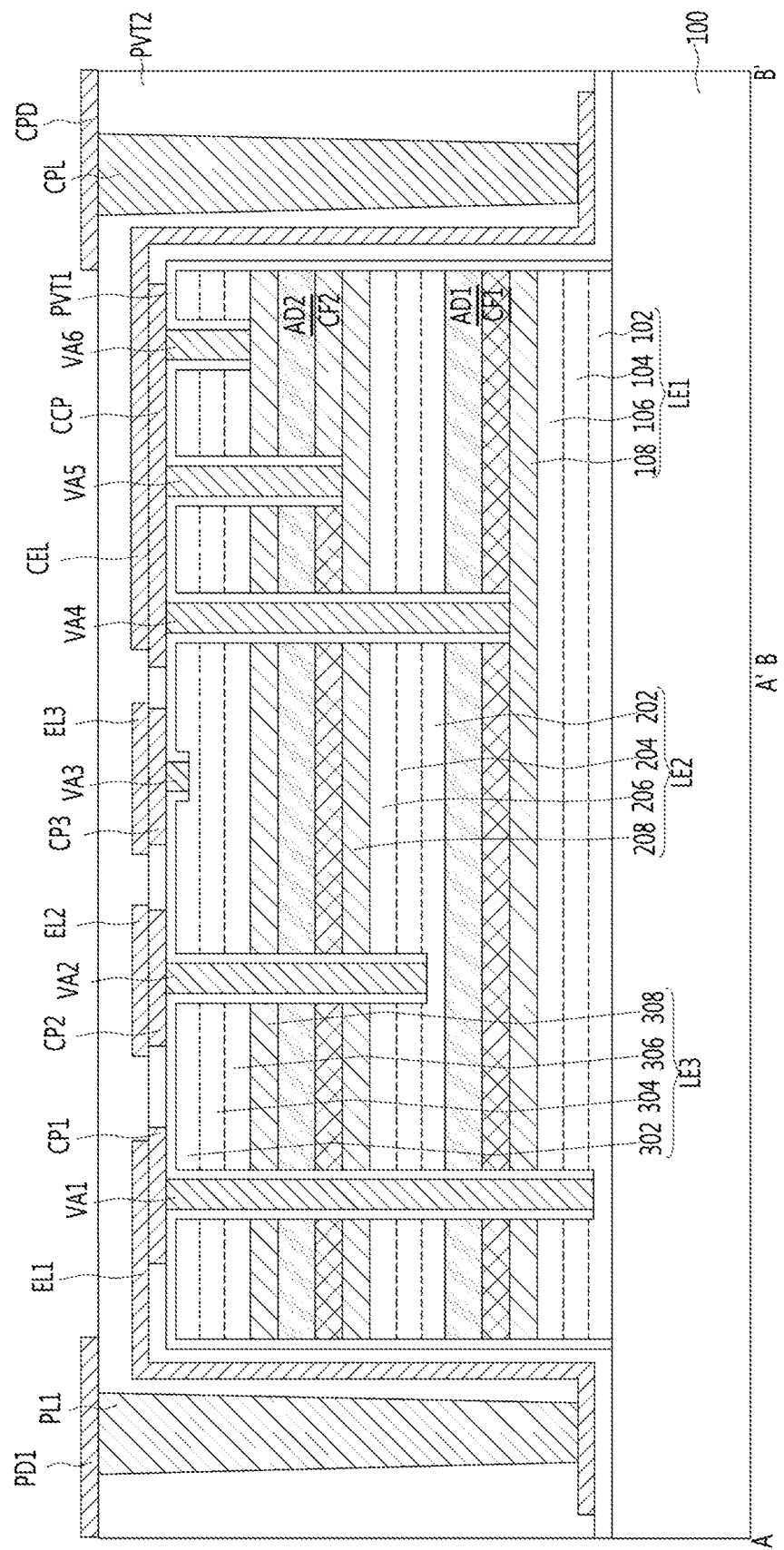
FIG. 2B is a cross-sectional view taken along lines A-A' and B-B' of FIG. 2A.
Figure 3A:
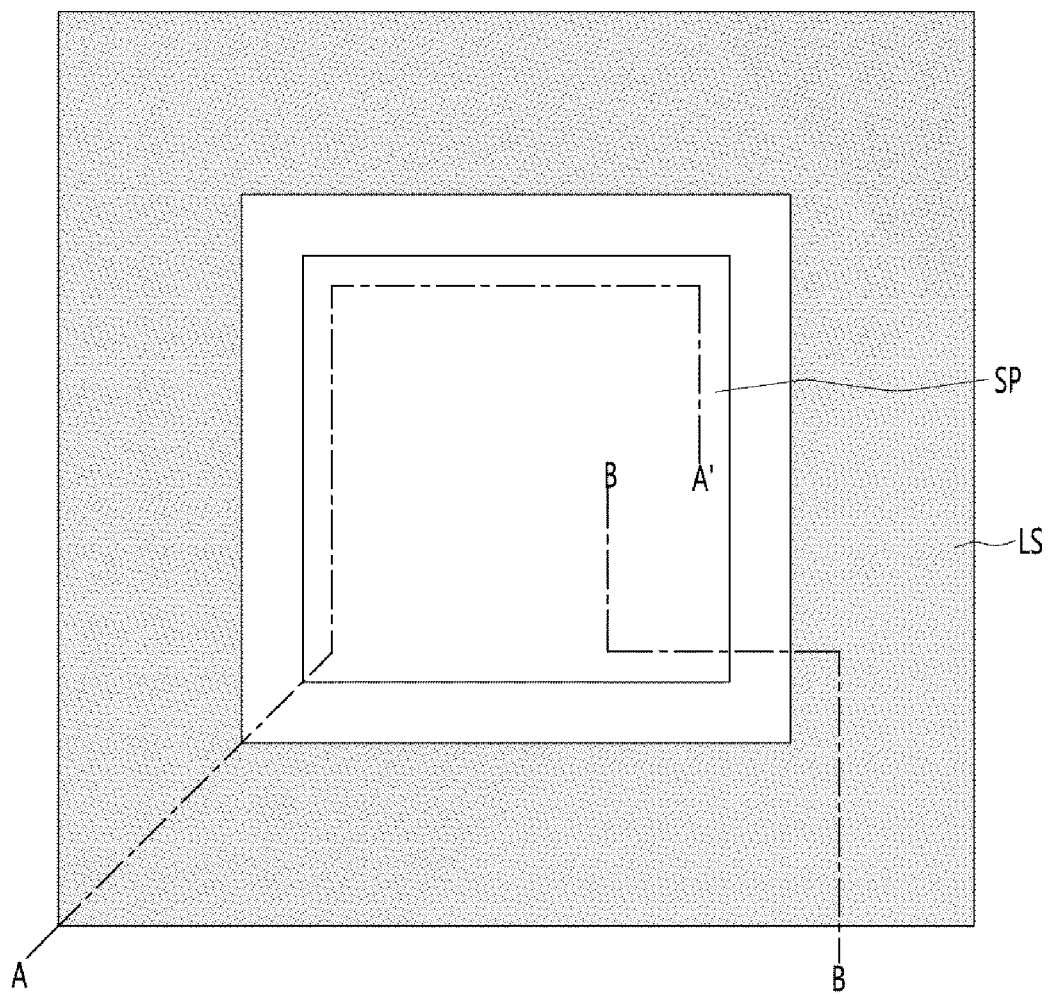
FIG. 3A is a top view of a light emitting device according to still another exemplary embodiment.
Figure 3B:
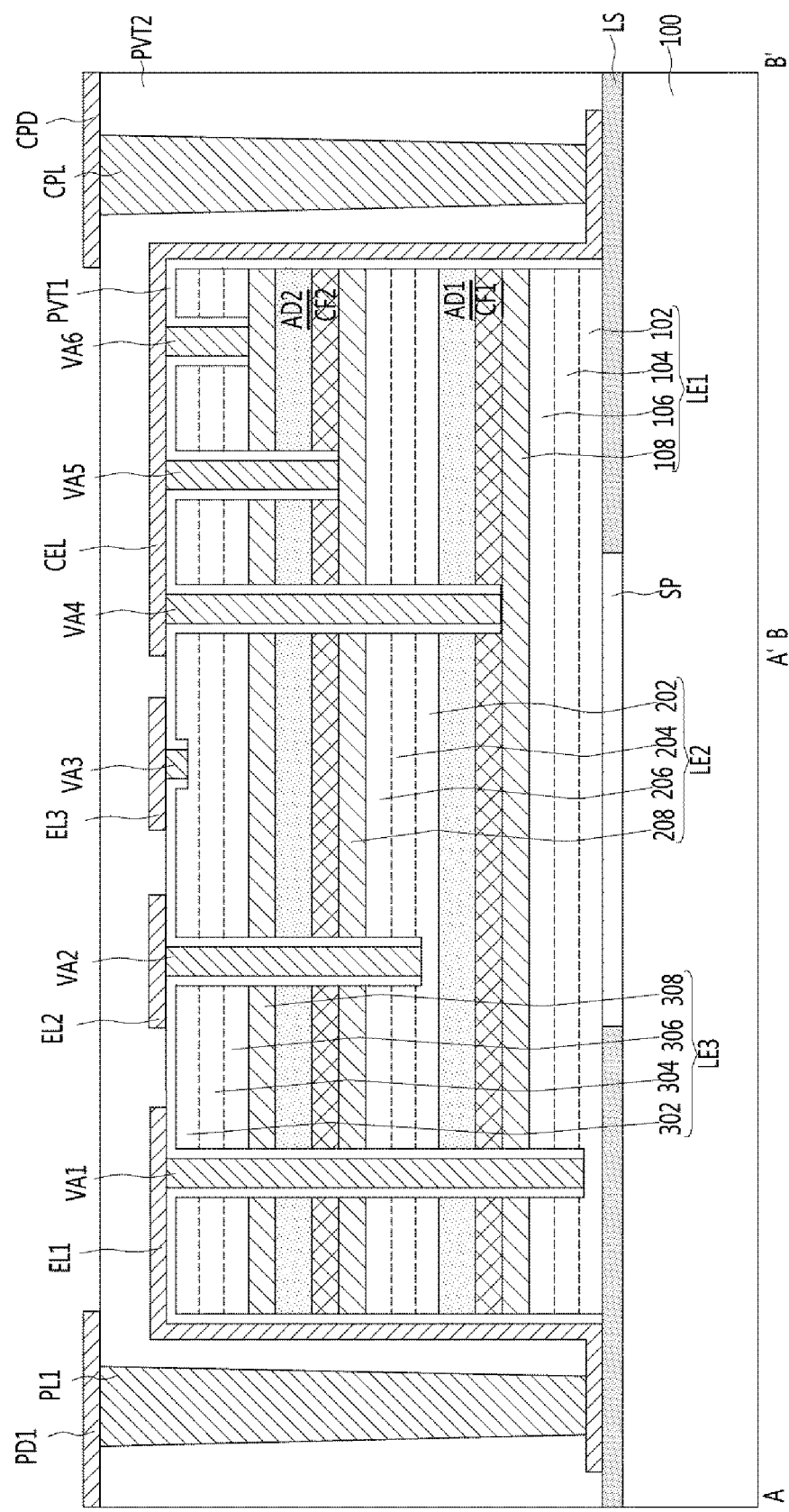
FIG. 3B is a cross-sectional view taken along lines A-A' and B-B' of FIG. 3A.

FIG. 1A is a top view of a light emitting device according to an exemplary embodiment, and FIG. 1B is a cross-sectional view taken along lines A-A' and B-B' of FIG. 1A. FIG. 2A is a top view of a light emitting device according to another exemplary embodiment, and FIG. 2B is a cross-sectional view taken along lines A-A' and B-B' of FIG. 2A. FIG. 3A is a top view of a light emitting device according to still another exemplary embodiment, and FIG. 3B is a cross-sectional view taken along lines A-A' and B-B' of FIG. 3A.

Referring to FIGS. 1A, 1B, 2A, 2B, 3A, and 3C, a light emitting device may include substrate 100, a first light emitting part LE1, a second light emitting part LE2, and a third light emitting part LE3, which are vertically stacked on the substrate 100.

The substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), or silicon. In some exemplary embodiments, the substrate 100 may be a patterned sapphire substrate. According to an exemplary embodiment, the substrate 100 may include a material, which transmits visible light. In some exemplary embodiments, the substrate 100 may be omitted.

When the substrate 100 is a light extraction surface of the light emitting device, the wavelength of light emitted from the first light emitting part LE1 may be the shortest, the wavelength of light emitted from the second light emitting part LE2 may be longer than the wavelength of light emitted from the first light emitting part LE1 and be shorter than the wavelength of light emitted from the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light. However, the inventive concepts are not limited thereto. For example, in some exemplary embodiments, the second light emitting part LE2 may emit light having a shorter wavelength than that emitted from the first light emitting part LE1.

The first light emitting part LE1 may include a first n-type semiconductor layer 102, a first active layer 104, a first p-type semiconductor layer 106, and a first ohmic layer 108. The second light emitting part LE2 may include a second n-type semiconductor layer 202, a second active layer 204, a second p-type semiconductor layer 206, and a second ohmic layer 208. The third light emitting part LE3 may include a third n-type semiconductor layer 302, a third active layer 304, a third p-type semiconductor layer 306, and a third ohmic layer 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208, and the third ohmic layer 308, a transparent conductive oxide (TCO), such as a tin oxide (SnO), indium oxide ($InO_2$), zinc oxide (ZnO), indium tin zinc oxide (ITZO), or an indium tin oxide (ITO) may be used.

The first light emitting part LE1 may be spaced apart from the second light emitting part LE2 with a first adhesion part AD1 interposed therebetween. For example, the first ohmic layer 108 of the first light emitting part LE1 and the second n-type semiconductor layer 202 of the second light emitting part LE2 may face each other with the first adhesion part AD1 disposed therebetween. As another example, the first ohmic layer 108 of the first light emitting part LE1 and the second ohmic layer 208 of the second light emitting part LE2 may face each other with the first adhesion part AD1 interposed therebetween.

The second light emitting part LE2 may be spaced apart from the third light emitting part LE3 with a second adhesion part AD2 interposed therebetween. For example, the second ohmic layer 208 of the second light emitting part LE2 and the third ohmic layer 308 of the third light emitting part LE3 may face each other with the second adhesion part AD2 interposed therebetween. As another example, the second ohmic layer 208 of the second light emitting part LE2 and the third n-type semiconductor layer 302 of the third light emitting part LE3 may face each other with the second adhesion part AD2 interposed therebetween.

Each of the first adhesion part AD1 and the second adhesion part AD2 may include a material, which transmits visible light and has an insulation property. Each of the first adhesion part AD1 and the second adhesion part AD2 may include polymer, resist, or polyimide. For example, each of the first adhesion part AD1 and the second adhesion part AD2 may include at least one of spin-on-glass (SOG), benzo cyclo butadiene (BCB), hydrogen silsesquioxanes (HSQ), SU-8 photoresist, epoxy, poly arylene ether (PAE) based Flare™, methylsilsesquioxane (MSSQ), polymethylmethacrylate (PMMA), polydimethylsiloxane (PDMS), fluoropolymer, polyimide, methylsilisequioxane (MSSQ), polyethereherketone (PEEK), aromatic thermosetting polyester (ATSP), polyvinylidene chloride (PVDC), liquid-crystal polymer (LCP), or wax.

The light emitting device may further include a first color filter CF1, which is disposed between the first light emitting part LE1 and the second light emitting part LE2, and a second color filter CF2, which is disposed between the second light emitting part LE2 and the third light emitting part LE3. The first color filter CF1 may be disposed on the first ohmic layer 108 of the first light emitting part LE1 or the second ohmic layer 208 of the second light emitting part LE2. The second color filter CF2 may be disposed on the second ohmic layer 208 of the second light emitting part LE2 or the third ohmic layer 308 of the third light emitting part LE3. The first color filter CF1 may reflect light emitted from the first light emitting part LE1 and pass light emitted from the second light emitting part LE2 and the third light emitting part LE3, so that light emitted from the first light emitting part LE1 does not exert an influence on each of the second light emitting part LE2 and the third light emitting part LE3. The second color filter CF2 may reflect light emitted from the first light emitting part LE1 and the second light emitting part LE2, and pass light emitted from the third light emitting part LE3, so that light emitted from the first light emitting part LE1 and the second light emitting part LE2 does not exert an influence on the third light emitting part LE3. Each of the first color filter CF1 and the second color filter CF2 may include a distributed Bragg reflector (DBR) having a structure, in which $TiO_2$ and $SiO_2$ are alternately stacked. The first color filter CF1 may be different from the second color filter CF2 in terms of the number of alternation layers therein and the thickness thereof. In some exemplary embodiments, the first color filter CF1 and the second color filter CF2 may be selectively omitted.

The light emitting device may further include a first extended pattern EL1 electrically coupled with the first n-type semiconductor layer 102, a second extended pattern EL2 electrically coupled with the second n-type semiconductor layer 202, a third extended pattern EL3 electrically coupled with the third n-type semiconductor layer 302, and a common extended pattern CEL electrically coupled in common with the first ohmic layer 108, the second ohmic layer 208, and the third ohmic layer 308. According to an exemplary embodiment, the first extended pattern EL1, the second extended pattern EL2, the third extended pattern EL3, and the common extended pattern CEL may be disposed on the third light emitting part LE3 while being spaced apart from each other. For example, when the light emitting device has a quadrangular structure when viewed from the top, the first extended pattern EL1, the second extended pattern EL2, the third extended pattern EL3, and the common extended pattern CEL may be disposed at the respective corner portions of the quadrangular light emitting device. Each of the first extended pattern EL1, the second extended pattern EL2, the third extended pattern EL3, and the common extended pattern CEL may include at least one of Au, Ag, Ni, Al, Rh, Pd, Ir, Ru, Mg, Zn, Pt, Hf, Cr, Ti, Ta, and Cu, or an alloy thereof.

While the common extended pattern CEL is illustrated as being electrically coupled in common to the first ohmic layer 108, the second ohmic layer 208, and the third ohmic layer 308, however, the inventive concepts are not limited thereto. For example, in some exemplary embodiments, the common extended pattern CEL may be electrically coupled in common to the first n-type semiconductor layer 102, the second n-type semiconductor layer 202, and the third n-type semiconductor layer 302.

The light emitting device may further include a first via pattern VA1 passing through the third light emitting part LE3, the second adhesion part AD2, the second color filter CF2, the second light emitting part LE2, the first adhesion part AD1, the first color filter CF1, the first ohmic layer 108, the first p-type semiconductor layer 106, and the first active layer 104, and couples the first n-type semiconductor layer 102 to the first extended pattern ELL a second via pattern VA2 passing through the third light emitting part LE3, the second adhesion part AD2, the second color filter CF2, the second ohmic layer 208, the second p-type semiconductor layer 206, and the second active layer 204, and couples the second n-type semiconductor layer 202 to the second extended pattern EL2, and a third via pattern VA3 coupling the third n-type semiconductor layer 302 to the third extended pattern EL3. In some exemplary embodiments, the third via pattern VA3 may be omitted.

The light emitting device may further include a fourth via pattern VA4 passing through the third light emitting part LE3, the second adhesion part AD2, the second color filter CF2, the second light emitting part LE2, the first adhesion part AD1, and the first color filter CF1, and couples the first ohmic layer 108 to the common extended pattern CEL, a fifth via pattern VA5 passing through the third light emitting part LE3, the second adhesion part AD2, and the second color filter CF2, and couples the second ohmic layer 208 to the common extended pattern CEL, and a sixth via pattern VA6 passing through the third n-type semiconductor layer 302, the third active layer 304, and the third p-type semiconductor layer 306 and couples the third ohmic layer 308 to the common extended pattern CEL.

Each of the first via pattern VA1, the second via pattern VA2, the third via pattern VA3, the fourth via pattern VA4, the fifth via pattern VA5, and the sixth via pattern VA6 may include at least one of Au, Ag, Ni, Al, Rh, Pd, Ir, Ru, Mg, Zn, Pt, Hf, Cr, Ti, Ta, and Cu, or an alloy thereof.

According to an exemplary embodiment, the first via pattern VA1 and the first extended pattern EL1 may be integrated with each other, the second via pattern VA2 and the second extended pattern EL2 may be integrated with each other, the third via pattern VA3 and the third extended pattern EL3 may be integrated with each other, and the fourth via pattern VA4, the fifth via pattern VA5, and the sixth via pattern VA6, and the common extended pattern CEL may be integrated with one another.

The light emitting device may further include a first passivation layer PVT1, which surrounds the outer sidewalls of the first via pattern VA1, the second via pattern VA2, the third via pattern VA3, the fourth via pattern VA4, the fifth via pattern VA5, and the sixth via pattern VA6, extends onto the third light emitting part LE3, and insulates the first extended pattern EL1, the second extended pattern EL2, the third extended pattern EL3, and the common extended pattern CEL from the third light emitting part LE3. The first passivation layer PVT1 may include at least one of $SiN_x$, $TiN_x$, $TiO_x$, $TaO_x$, $ZrO_x$, $HfO_x$, $Al_xO_y$, and $SiO_x$.

The light emitting device may further include a first pillar pattern PL1, which electrically couples the first extended pattern EL1 and a first pad PD1, a second pillar pattern PL2, which electrically couples the second extended pattern EL2 and a second pad PD2, a third pillar pattern PL3, which electrically couples the third extended pattern EL3 and a third pad PD3, and a common pillar pattern CPL, which electrically couples the common extended pattern CEL and a common pad CPD. Each of the first pillar pattern PL1, the second pillar pattern PL2, the third pillar pattern PL3, and the common pillar pattern CPL may include at least one of Au, Ag, Ni, Al, Rh, Pd, Ir, Ru, Mg, Zn, Pt, Hf, Cr, Ti, Ta, and Cu, or an alloy thereof.

The light emitting device may further include a second passivation layer PVT2, which is disposed between the first pillar pattern PL1, the second pillar pattern PL2, the third pillar pattern PL3, and the common pillar pattern CPL on the first extended pattern EL1, the second extended pattern EL2, the third extended pattern EL3, and the common extended pattern CEL. The second passivation layer PVT2 may include at least one of an organic material, such as epoxy molding compound (EMC), epoxy resin, silicone, photoresist, BCB, Flare™, MSSQ, PMMA, PDMS, fluoropolymer, polyimide, MSSQ, PEEK, ATSP, PVDC, LCP, or sax, or an inorganic material, such as $SiN_x$, $TiN_x$, $TiO_x$, $TaO_x$, $ZrO_x$, $HfO_x$, $Al_xO_y$, or $SiO_x$. When the second passivation layer PVT2 includes an organic material, the second passivation layer PVT2 may be formed in various colors, such as black or transparent.

According to an exemplary embodiment, the critical dimension (CD) of each of the first light emitting part LE1, the second light emitting part LE2, and the third light emitting part LE3 may be about 50 μm to about 80 μm. In this case, when the first pad PD1, the second pad PD2, the third pad PD3, and the common pad CPD are directly electrically coupled with the first light emitting part LE1, the second light emitting part LE2, and the third light emitting part LE3, a separation distance between the first pad PD1, the second pad PD2, the third pad PD3, and the common pad CPD may become too narrow. As such, forming the first extended pattern EL1, the second extended pattern EL2, the third extended pattern EL3, and the common extended pattern CEL, and the first pillar pattern PL1, the second pillar pattern PL2, the third pillar pattern PL3, and the common pillar pattern CPL according to exemplary embodiments may increase the distance between the first pad PD1, the second pad PD2, the third pad PD3, and the common pad CPD. Moreover, as each of the first extended pattern EL1, the second extended pattern EL2, the third extended pattern EL3, and the common extended pattern CEL, and the first pillar pattern PL1, the second pillar pattern PL2, the third pillar pattern PL3, and the common pillar pattern CPL includes metal, light emitted from an adjacent light emitting device may be reflected or shielded.

According to another exemplary embodiment shown in FIGS. 2A and 2B, a light emitting device may further include a first conductive pattern CP1, which electrically couples the first via pattern VA1 and the first extended pattern EL1, a second conductive pattern CP2, which electrically couples the second via pattern VA2 and the second extended pattern EL2, a third conductive pattern CP3, which electrically couples the third via pattern VA3 and the third extended pattern EL3, and a common conductive pattern CCP, which electrically couples a common via pattern and the common extended pattern CEL. Each of the first conductive pattern CP1, the second conductive pattern CP2, the third conductive pattern CP3, and the common conductive pattern CCP may include at least one of Au, Ag, Ni, Al, Rh, Pd, Ir, Ru, Mg, Zn, Pt, Hf, Cr, Ti, and Cu, or an alloy thereof. By adjusting the positions and the widths of the first conductive pattern CP1, the second conductive pattern CP2, the third conductive pattern CP3, and the common conductive pattern CCP, the separation distance of the first pad PD1, the second pad PD2, the third pad PD3, and the common pad CPD may be flexibly adjusted.

FIG. 1A is a top view in a direction facing the third light emitting part LE3, and FIG. 3A is a top view in a direction facing the first light emitting part LE1. According to the still another exemplary embodiment, a light emitting device may further include a light shielding layer LS disposed on one surface of the first light emitting part LE1, which covers a portion of the light extraction surface of the light emitting device. The light shielding layer LS may include a photoresist or a black matrix. In this manner, as the light shielding layer LS covers a portion of the light extraction surface and reduces the area of the light extraction surface, the contrast of the light emitting device may be increased. As such, the light extraction effect of the light emitting device may be improved.

In the light emitting device shown in FIGS. 3A and 3B, the light shielding layer LS may cover a portion of the light extraction surface, and a portion SP of a surface of the first light emitting part LE1 not covered by the light shielding layer LS may be exposed to the air. In some exemplary embodiments, an adhesion part having a visible light transmitting property may be disposed on the portion SP of the first light emitting part LE1. In this case, the top surface of the adhesion part may be coplanar with the top surface of the light shielding layer LS. The adhesion part disposed on the portion SP of the first light emitting part LE1 may include SOG, BCB, HSQ, or SU-8 photoresist.

Figure 4A:
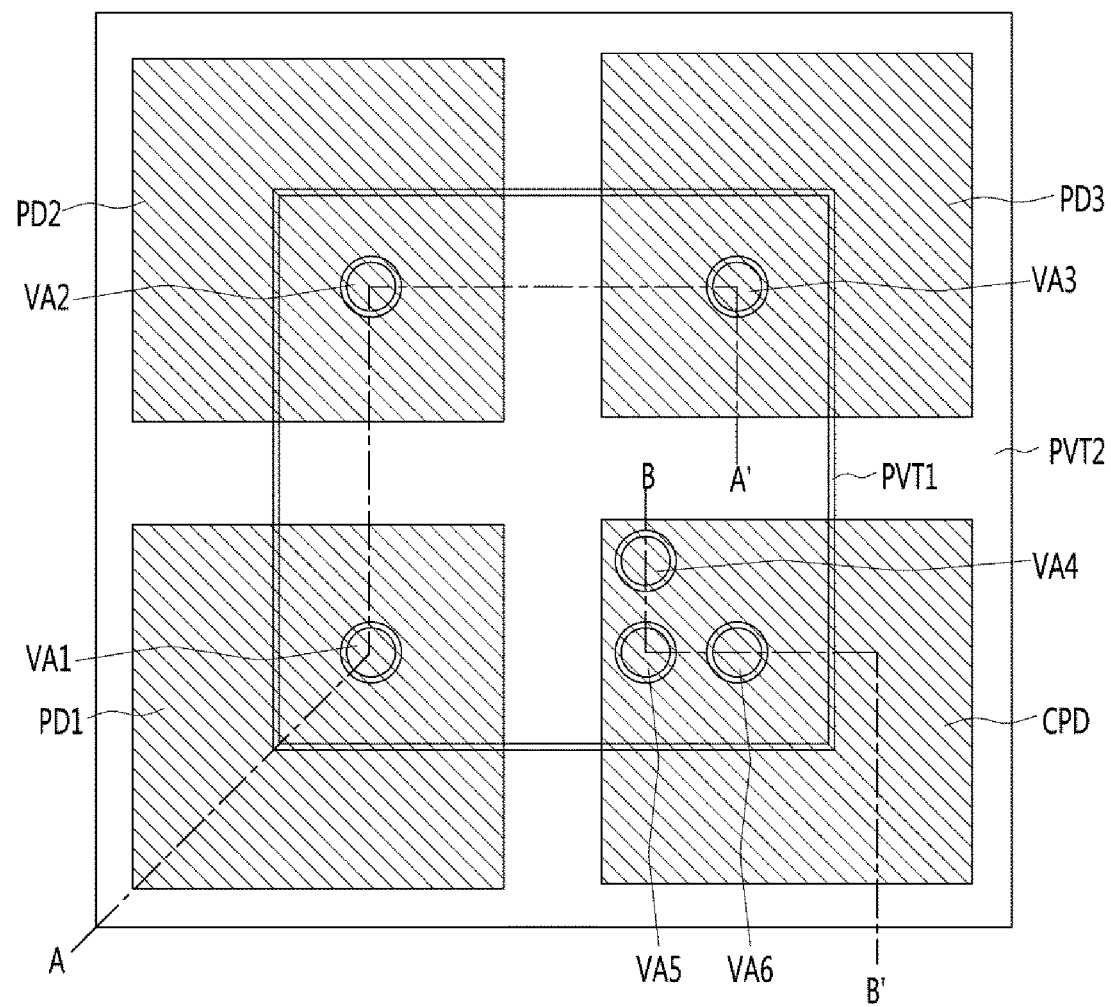
FIG. 4A is a top view of a light emitting device according to yet still another exemplary embodiment.
Figure 4B:
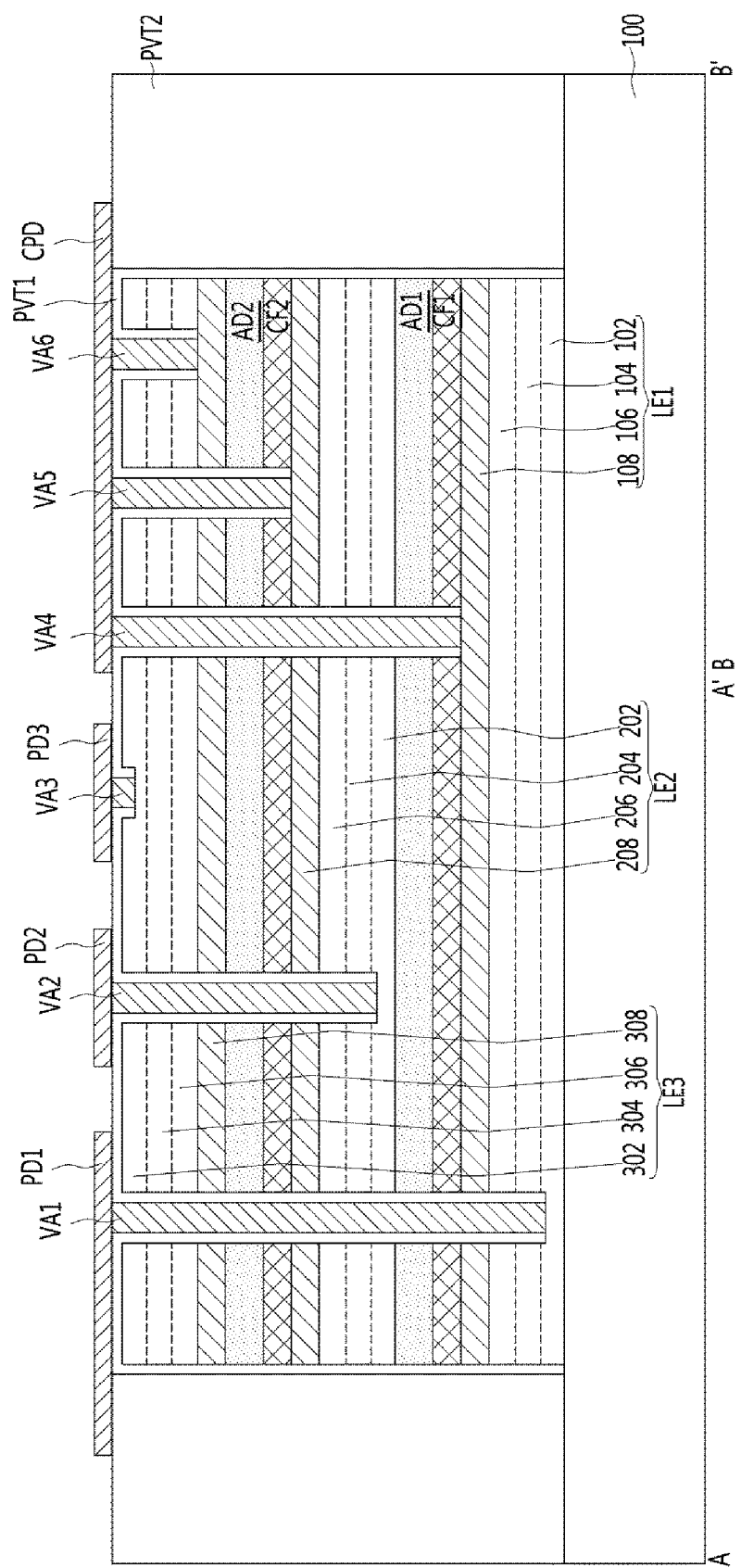
FIG. 4B is a cross-sectional view taken along lines A-A' and B-B' of FIG. 4A.

FIG. 4A is a top view of a light emitting device according to yet still another exemplary embodiment, and FIG. 4B is a cross-sectional view taken along lines A-A' and B-B' of FIG. 4A.

Referring to FIGS. 4A and 4B, a light emitting device may include a substrate 100, and a first light emitting part LE1, a second light emitting part LE2, and a third light emitting part LE3, which are vertically stacked on the substrate 100.

The first light emitting part LE1 may include a first n-type semiconductor layer 102, a first active layer 104, a first p-type semiconductor layer 106, and a first ohmic layer 108, the second light emitting part LE2 may include a second n-type semiconductor layer 202, a second active layer 204, a second p-type semiconductor layer 206, and a second ohmic layer 208, and the third light emitting part LE3 may include a third n-type semiconductor layer 302, a third active layer 304, a third p-type semiconductor layer 306, and a third ohmic layer 308.

The light emitting device may further include a first via pattern VA1, a second via pattern VA2, a third via pattern VA3, a fourth via pattern VA4, a fifth via pattern VA5, and a sixth via pattern VA6, a first passivation layer PVT1, which surrounds the outer sidewalls of the first via pattern VA1, the second via pattern VA2, the third via pattern VA3, the fourth via pattern VA4, the fifth via pattern VA5, and the sixth via pattern VA6 and extends to one surface of the third light emitting part LE3, and a second passivation layer PVT2, which surrounds the outer sidewalls of the first light emitting part LE1, the second light emitting part LE2, and the third light emitting part LE3. According to an exemplary embodiment, the top surface of the second passivation layer PVT2 may be coplanar with the top surface of the first passivation layer PVT1.

The light emitting device may further include a first pad PD1, which is disposed on the first passivation layer PVT1 and the second passivation layer PVT2 and is electrically coupled with the first via pattern VA1, a second pad PD2, which is disposed on the first passivation layer PVT1 and the second passivation layer PVT2 and is electrically coupled with the second via pattern VA2, a third pad PD3, which is disposed on the first passivation layer PVT1 and the second passivation layer PVT2 and is electrically coupled with the third via pattern VA3, and a common pad CPD, which is disposed on the first passivation layer PVT1 and the second passivation layer PVT2 and is electrically coupled with the fourth via pattern VA4, the fifth via pattern VA5, and the sixth via pattern VA6.

According to the illustrated exemplary embodiment, since each of the first pad PD1, the second pad PD2, the third pad PD3, and the common pad CPD is extendedly disposed to overlap each of the first passivation layer PVT1 and the second passivation layer PVT2, each of the first pad PD1, the second pad PD2, the third pad PD3, and the common pad CPD may be disposed within a wide area.

Since the light emitting device according to the illustrated exemplary embodiment is substantially the same as the light emitting device described above with reference to FIGS. 1A and 1B, repeated descriptions thereof will be omitted to avoid redundancy.

Hereinafter, a method for manufacturing a light emitting device will be described. According to the illustrated exemplary embodiment, a method for manufacturing the light emitting device will be exemplarily described with reference to the light emitting device shown in FIGS. 1A and 1B.

FIGS. 5A to 11A are top views illustrating a method for manufacturing a light emitting device according to an exemplary embodiment, and FIGS. 5B to 11B are cross-sectional views taken along lines A-A' and B-B' of corresponding top view shown in FIGS. 5A to 11A.

Figure 5A:
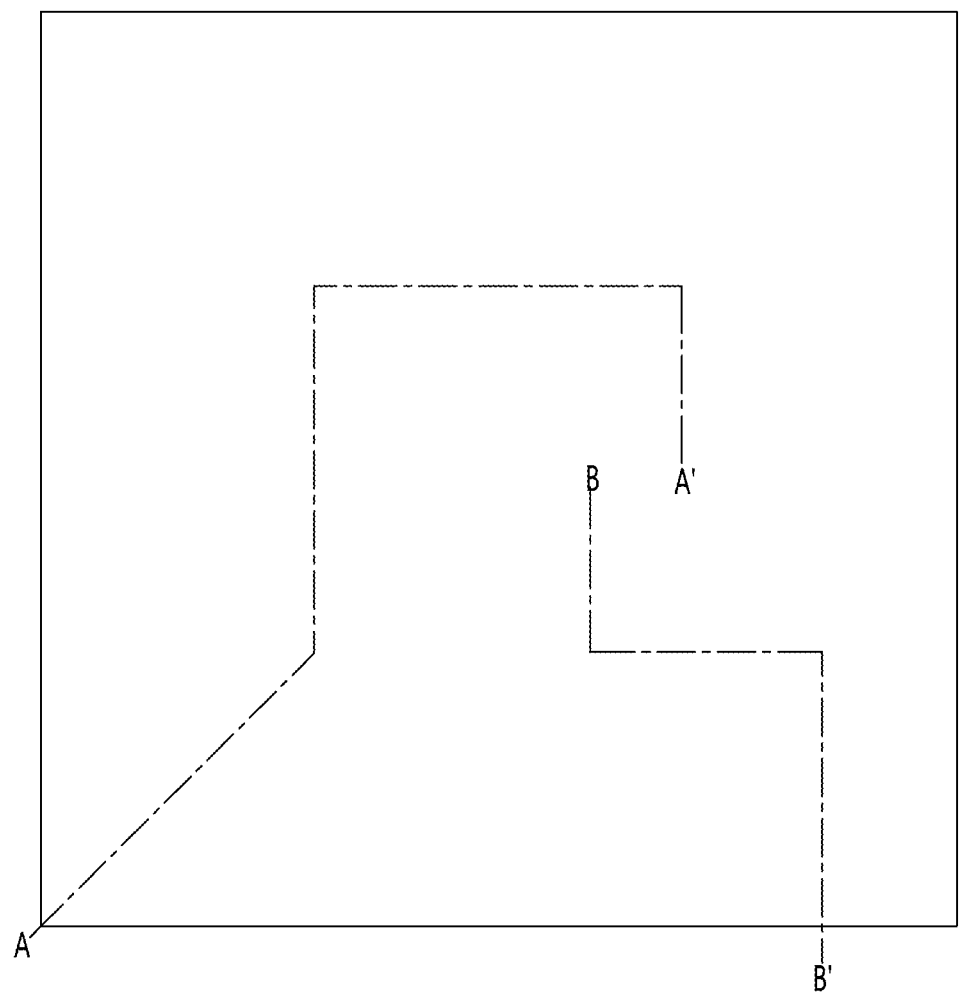
FIGS. 5A, 6A, 7A, 8A, 9A, 10A, and 11A are top views illustrating a method for manufacturing a light emitting device according to an exemplary embodiment.
Figure 5B:
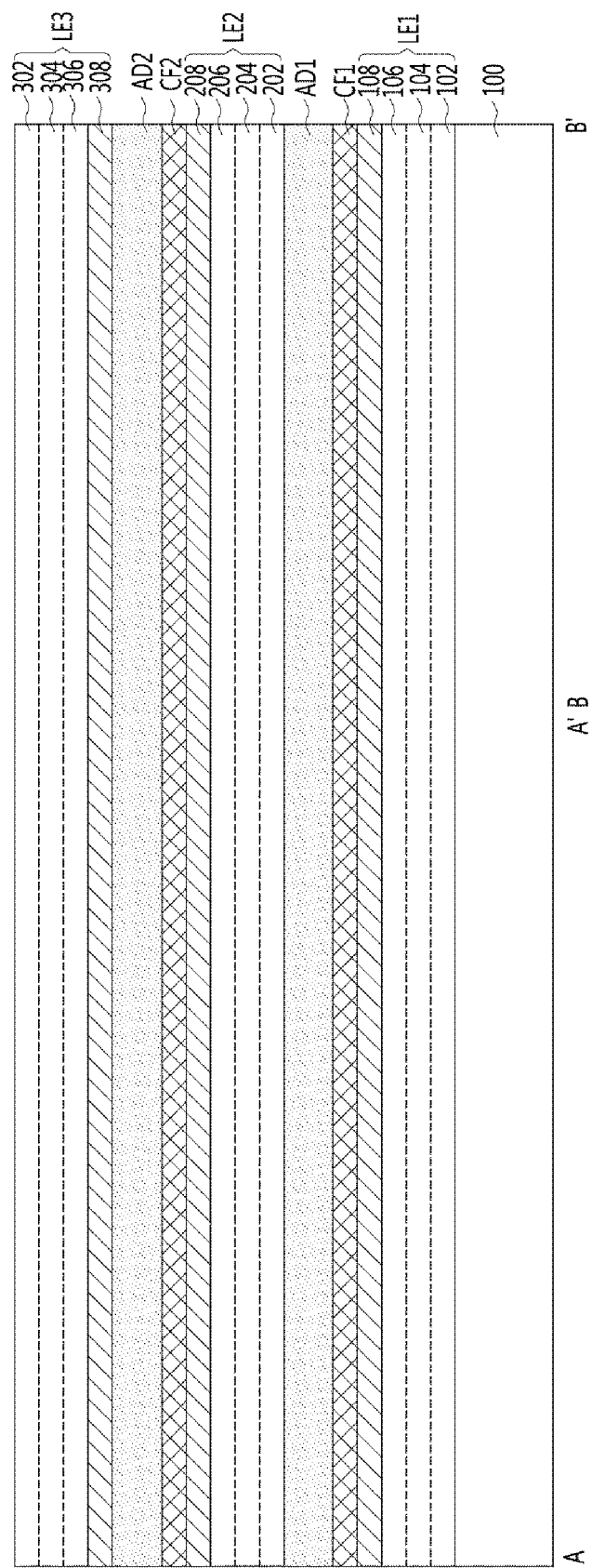
FIGS. 5B, 6B, 7B, 8B, 9B, 10B, and 11B are cross-sectional views taken along lines A-A' and B-B' of FIGS. 5A to 11A, respectively.

Referring to FIGS. 5A and 5B, a first n-type semiconductor layer 102, a first active layer 104, a first p-type semiconductor layer 106, and a first ohmic layer 108 may be sequentially formed on a first substrate 100. The first n-type semiconductor layer 102, the first active layer 104, and the first p-type semiconductor layer 106 may be sequentially formed on the first substrate 100 by using a growing method, such as metal organic chemical vapor deposition (MOCVD), molecular beam epitaxy (MBE), hydride vapor phase epitaxy (HVPE), and metal-organic chloride (MOC). The first ohmic layer 108 may be formed on the first p-type semiconductor layer 106 through a chemical vapor deposition (CVD) process, physical vapor deposition (PVD) process, and the like.

By sequentially forming a second n-type semiconductor layer 202, a second active layer 204, a second p-type semiconductor layer 206, and a second ohmic layer 208 on a second substrate, a second light emitting part LE2 may be formed. The second n-type semiconductor layer 202, the second active layer 204, and the second p-type semiconductor layer 206 may be sequentially formed on the second substrate by using a growing method, such as MOCVD, MBE, HVPE, and MOC. The second ohmic layer 208 may be formed on the second p-type semiconductor layer 206 through a CVD process, a PVD process, and the like.

By turning over the second substrate, the second ohmic layer 208 may be disposed to face a support substrate. By using a detachable adhesion part, the second light emitting part LE2 may be bonded to the support substrate. After bonding the second light emitting part LE2 to the support substrate, the second substrate may be removed through a laser lift-off (LLO) process or a chemical lift-off (CLO) process.

By turning over the second substrate, the second n-type semiconductor layer 202 may be disposed to face the first ohmic layer 108, and the second light emitting part LE2 may be bonded to the first light emitting part LE1 through a first adhesion part AD1. After bonding the first light emitting part LE1 and the second light emitting part LE2, the support substrate may be removed through the detachable adhesion part.

By sequentially forming a third n-type semiconductor layer 302, a third active layer 304, a third p-type semiconductor layer 306, and a third ohmic layer 308 on a third substrate, a third light emitting part LE3 may be formed. The third n-type semiconductor layer 302, the third active layer 304, and the third p-type semiconductor layer 306 may be sequentially formed on the third substrate by using a growing method, such as MOCVD, MBE, HVPE, and MOC. The third ohmic layer 308 may be formed on the third p-type semiconductor layer 306 through a CVD process, or the like.

The third substrate may be turned over, such that the second n-type semiconductor layer 202 of the second light emitting part LE2 and the third ohmic layer 308 of the third light emitting part LE3 face each other, and the second light emitting part LE2 and the third light emitting part LE3 may be bonded to each other through a second adhesion part AD2. After bonding the second light emitting part LE2 and the third light emitting part LE3 by the second adhesion part AD2, the third substrate may be removed through an LLO or CLO process.

Figure 6A:
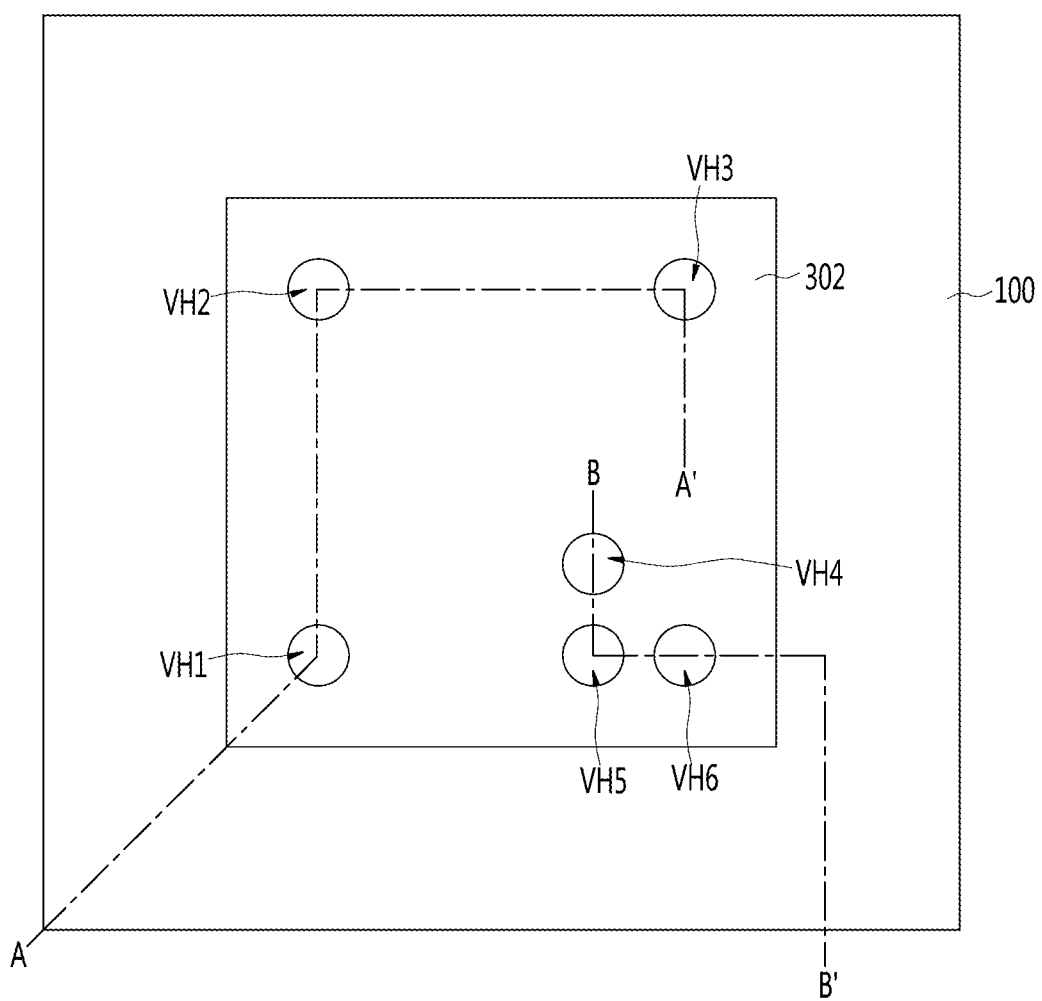
Figure 6B:
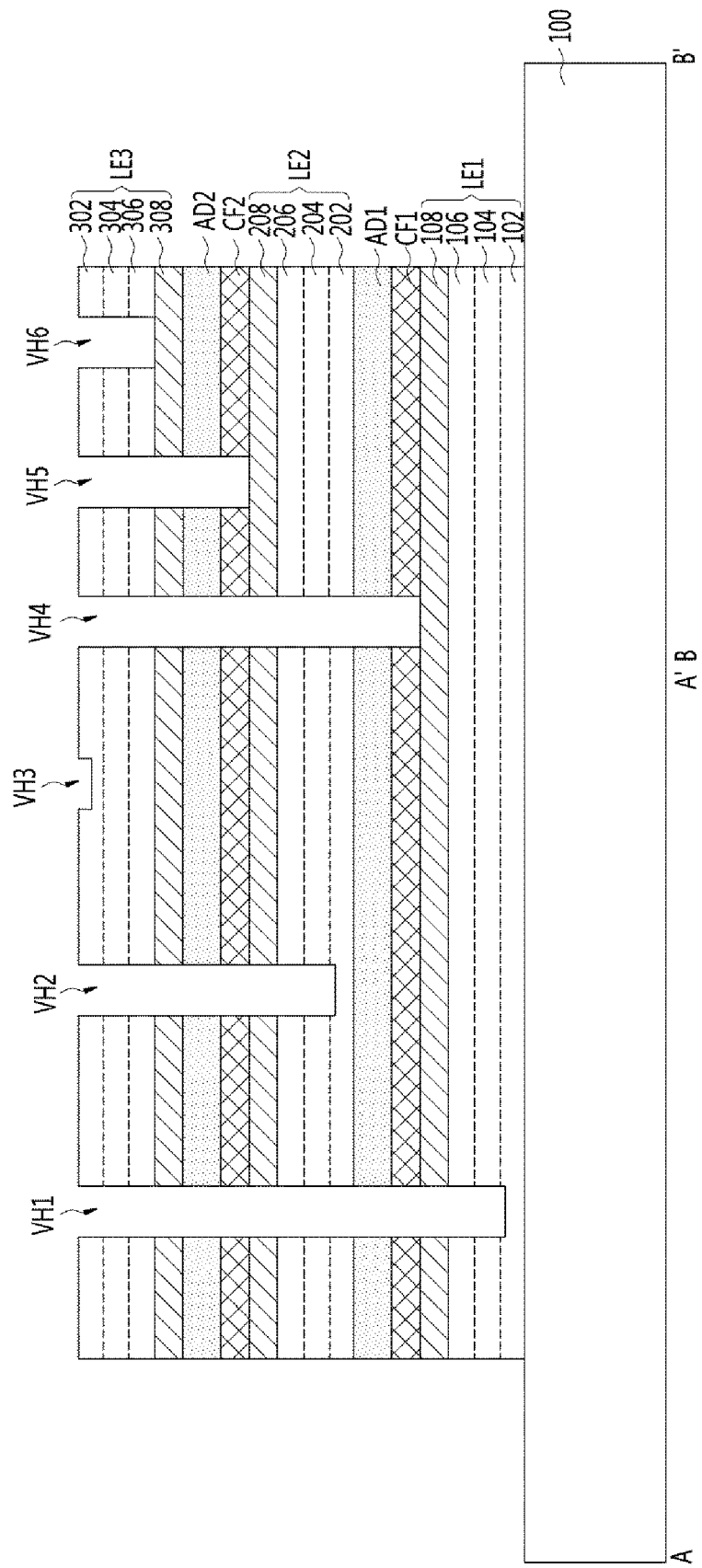

Referring to FIGS. 6A and 6B, by etching the third light emitting part LE3, the second light emitting part LE2, and the first light emitting part LE1, a first via hole VH1 exposing the first n-type semiconductor layer 102, a second via hole VH2 exposing the second n-type semiconductor layer 202, a third via hole VH3 exposing the third n-type semiconductor layer 302, a fourth via hole VH4 exposing the first ohmic layer 108, a fifth via hole VH5 exposing the second ohmic layer 208, and a sixth via hole VH6 exposing the third ohmic layer 308 may be formed.

According to an exemplary embodiment, while forming the first via hole VH1, the second via hole VH2, the third via hole VH3, the fourth via hole VH4, the fifth via hole VH5 and the sixth via hole VH6, the substrate 100 may be exposed by etching side surfaces of the first light emitting part LE1, the second light emitting part LE2, and the third light emitting part LE3. In this manner, each of the light emitting devices may be individually separated from one another. In some exemplary embodiments, each of the first light emitting part LE1, the second light emitting part LE2, and the third light emitting part LE3 may have an inclined sidewall. In some exemplary embodiments, each of the first via hole VH1, the second via hole VH2, the third via hole VH3, the fourth via hole VH4, the fifth via hole VH5, and the sixth via hole VH6 may have an inclined sidewall.

Figure 7A:
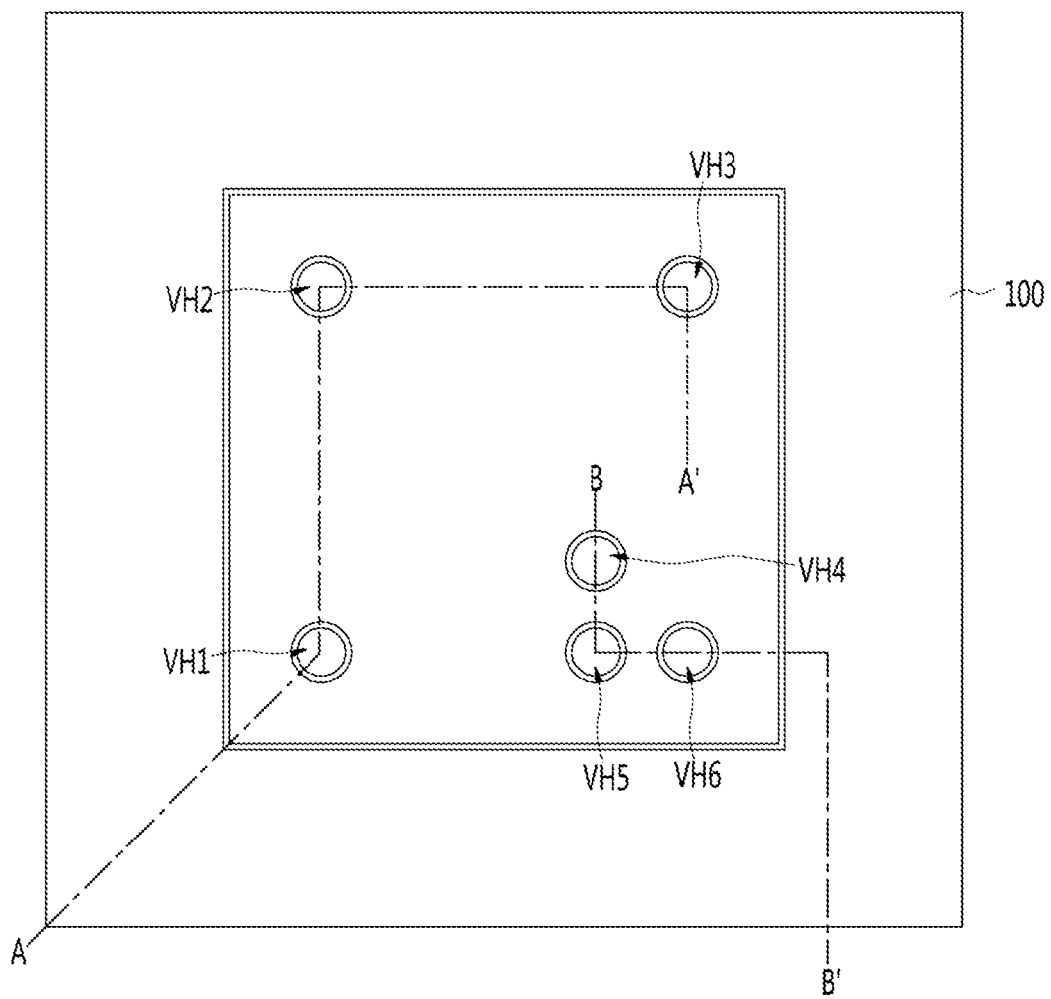
Figure 7B:
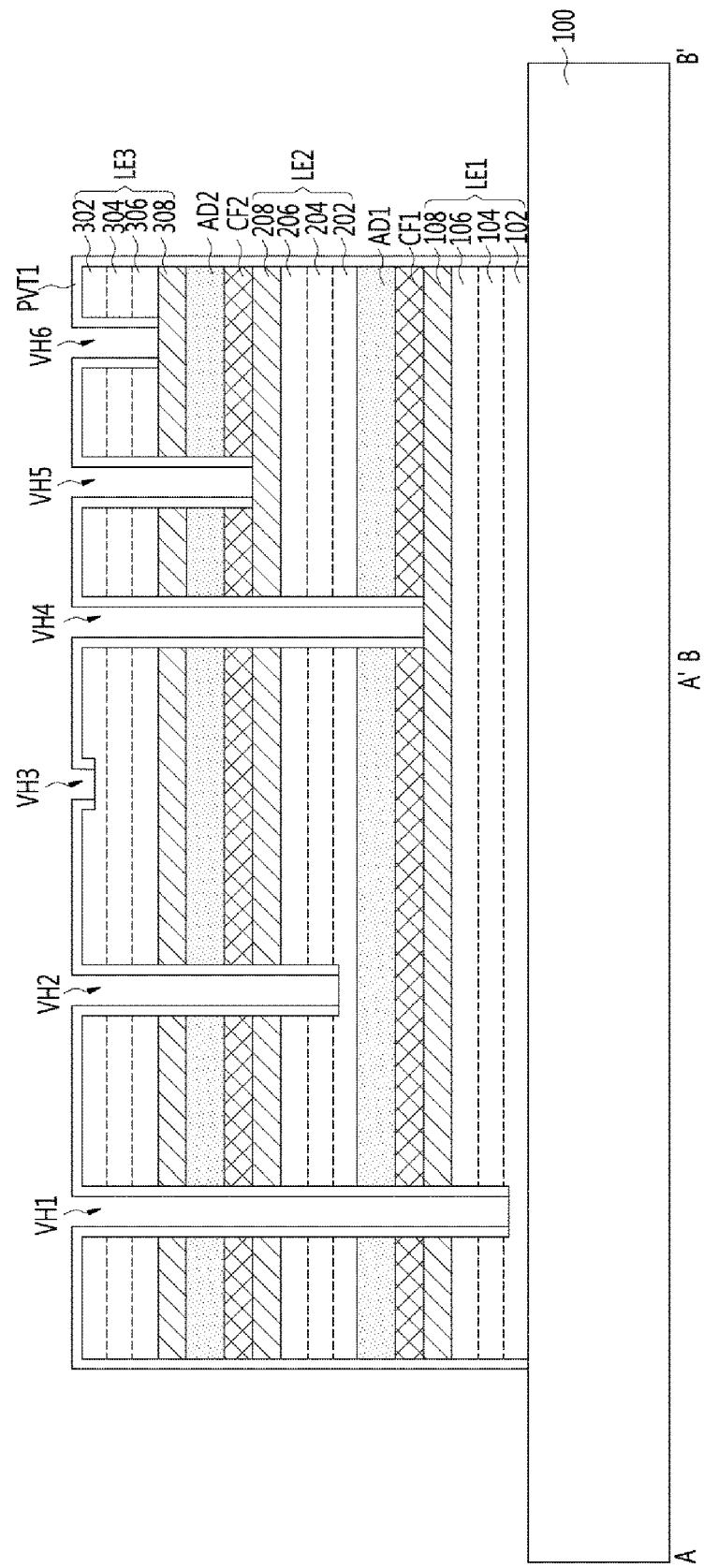

Referring to FIGS. 7A and 7B, a first passivation layer PVT1 may be conformally formed along the first light emitting part LE1, the second light emitting part LE2, and the third light emitting part LE3, while not entirely filing the first via hole VH1, the second via hole VH2, the third via hole VH3, the fourth via hole VH4, the fifth via hole VH5, and the sixth via hole VH6.

By etching the first passivation layer PVT1, the first n-type semiconductor layer 102 may be exposed at the bottom surface of the first via hole VH1, the second n-type semiconductor layer 202 may be exposed at the bottom surface of the second via hole VH2, the third n-type semiconductor layer 302 may be exposed at the bottom surface of the third via hole VH3, the first ohmic layer 108 may be exposed at the bottom surface of the fourth via hole VH4, the second ohmic layer 208 may be exposed at the bottom surface of the fifth via hole VH5, and the third ohmic layer 308 may be exposed at the bottom surface of the third ohmic layer 308.

Figure 8A:
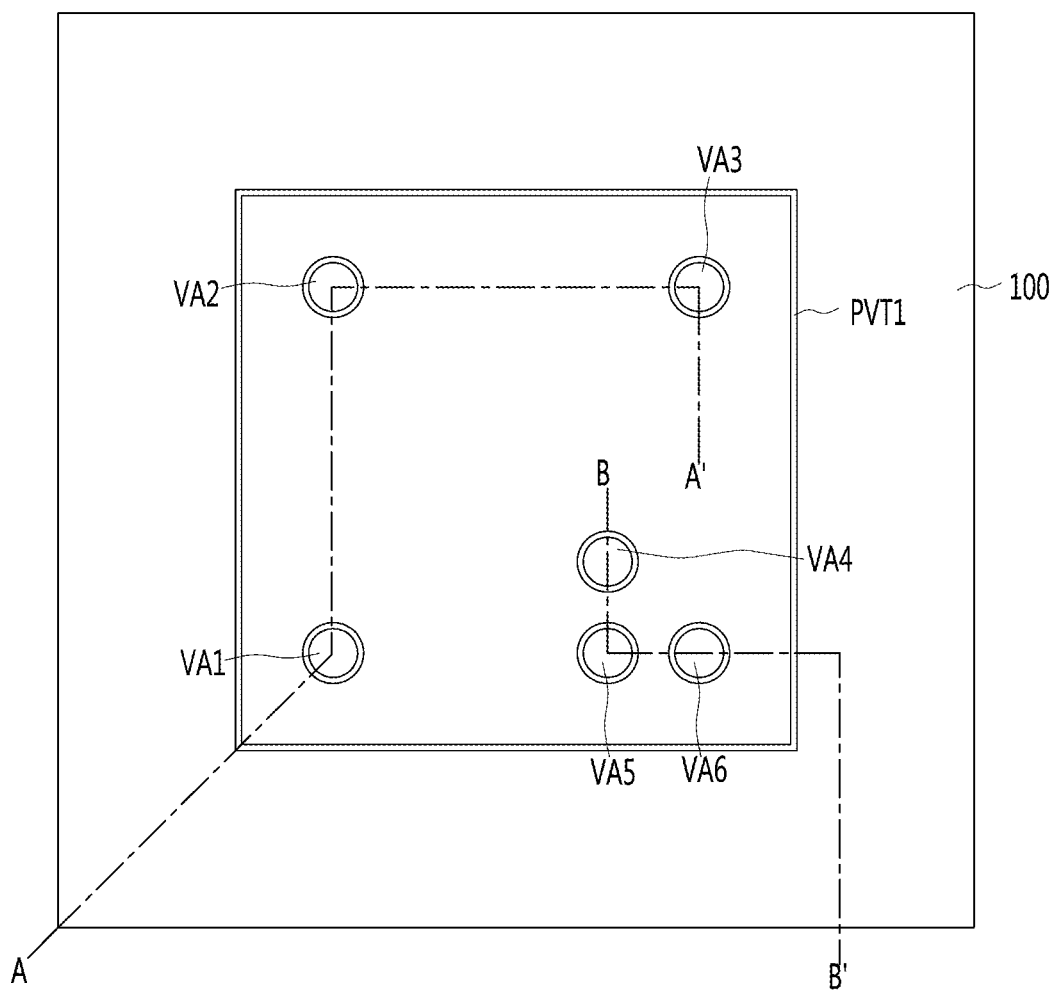
Figure 8B:
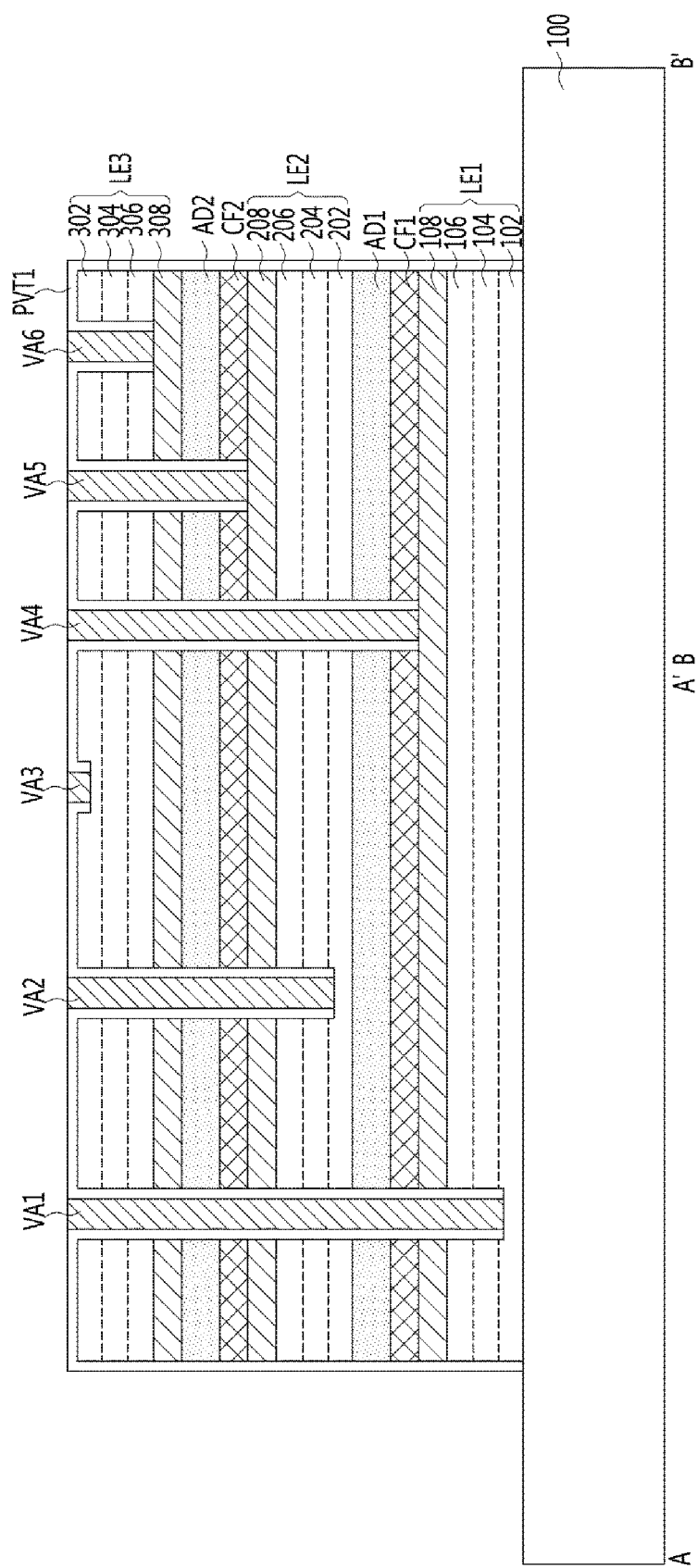

Referring to FIGS. 8A and 8B, a first via pattern VA1, a second via pattern VA2, a third via pattern VA3, a fourth via pattern VA4, a fifth via pattern VA5, and a sixth via pattern VA6 may be respectively formed to substantially fill the first via hole VH1, the second via hole VH2, the third via hole VH3, the fourth via hole VH4, the fifth via hole VH5, and the sixth via hole VH6, respectively, in which the first passivation layer PVT1 is formed.

The first via pattern VA1 may fill the first via hole VH1 and be brought into electrical contact with the first n-type semiconductor layer 102, the second via pattern VA2 may fill the second via hole VH2 and be brought into electrical contact with the second n-type semiconductor layer 202, the third via pattern VA3 may fill the third via hole VH3 and be brought into electrical contact with the third n-type semiconductor layer 302, the fourth via pattern VA4 may fill the fourth via hole VH4 and be brought into electrical contact with the first ohmic layer 108, the fifth via pattern VA5 may fill the fifth via hole VH5 and be brought into electrical contact with the second ohmic layer 208, and the sixth via pattern VA6 may fill the sixth via hole VH6 and be brought into electrical contact with the third ohmic layer 308.

According to an exemplary embodiment, the top surface of each of the first via pattern VA1, the second via pattern VA2, the third via pattern VA3, the fourth via pattern VA4, the fifth via pattern VA5 and the sixth via pattern VA6 may be coplanar with the top surface of the first passivation layer PVT1.

Figure 9A:
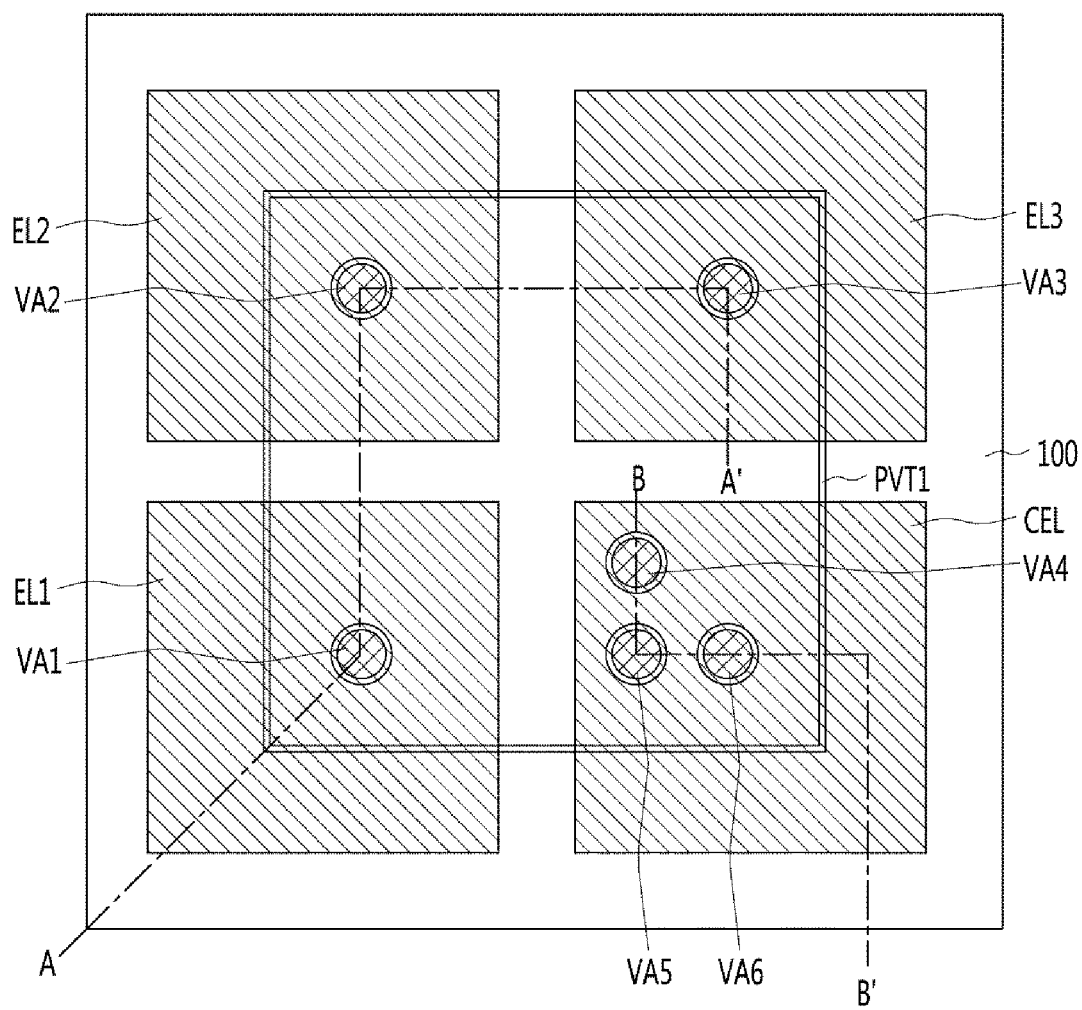
Figure 9B:
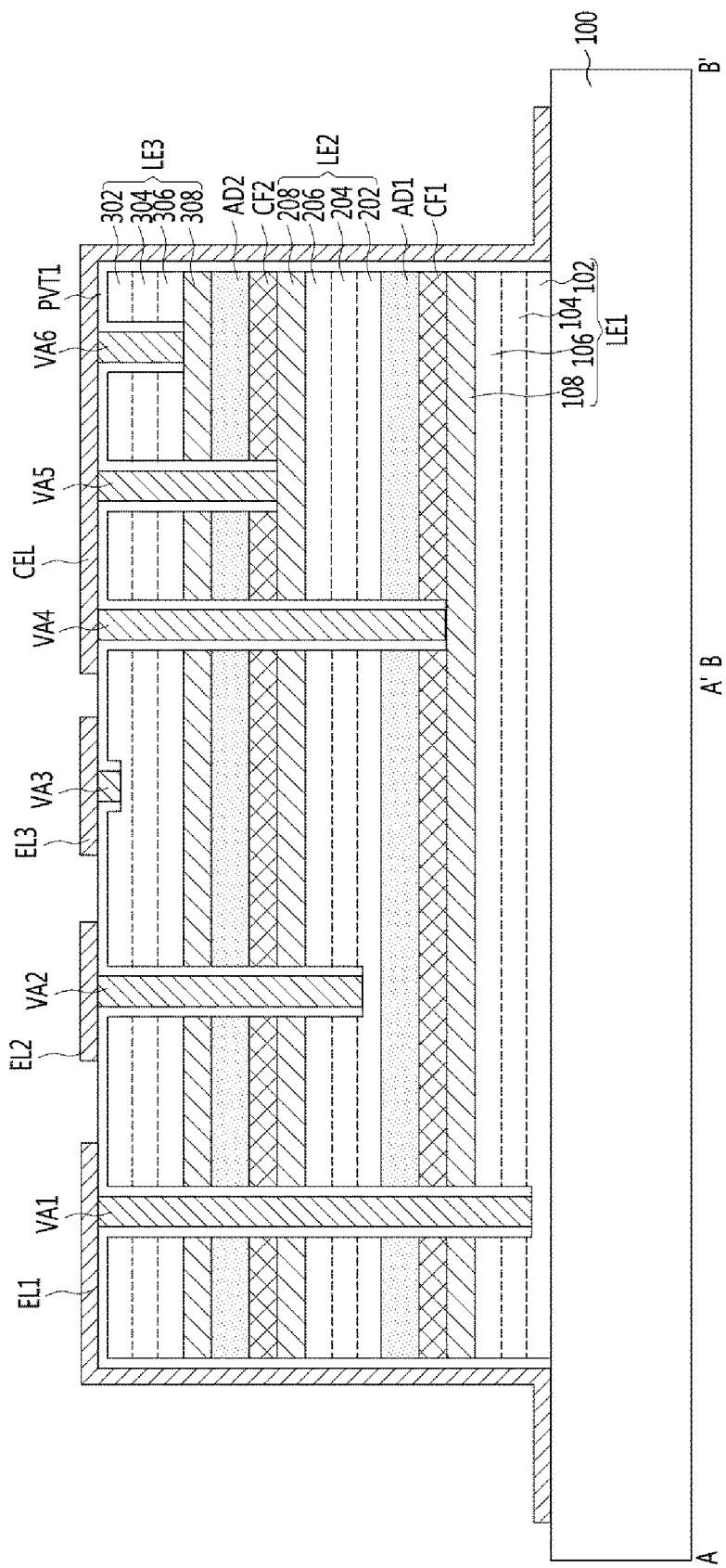

Referring to FIGS. 9A and 9B, a first extended pattern EL1, which is electrically coupled with the first via pattern VA1 and extends to the substrate 100, a second extended pattern EL2, which is electrically coupled with the second via pattern VA2 and extends to the substrate 100, a third extended pattern EL3, which is electrically coupled with the third via pattern VA3 and extends to the substrate 100, and a common extended pattern CEL, which is electrically coupled with the fourth via pattern VA4, the fifth via pattern VA5, and the sixth via pattern VA6 and extends to the substrate 100, may be formed.

The first extended pattern EL1 may be disposed on the first passivation layer PVT1 and be brought into electrical contact with the first via pattern VA1, which is formed on the third light emitting part LE3, and may extend onto the top surface of the substrate 100 along the side surfaces of the third light emitting part LE3, the second light emitting part LE2, and the first light emitting part LE1. The second extended pattern EL2 may be disposed on the first passivation layer PVT1 and be brought into electrical contact with the second via pattern VA2, which is formed on the third light emitting part LE3, and may extend to the top surface of the substrate 100 along the side surfaces of the third light emitting part LE3, the second light emitting part LE2, and the first light emitting part LE1. The third extended pattern EL3 may be disposed on the first passivation layer PVT1 and be brought into electrical contact with the third via pattern VA3, which is formed on the third light emitting part LE3, and may extend to the top surface of the substrate 100 along the side surfaces of the third light emitting part LE3, the second light emitting part LE2, and the first light emitting part LE1. The common extended pattern CEL may be disposed on the first passivation layer PVT1 and be brought into electrical contact with the fourth via pattern VA4, the fifth via pattern VA5, and the sixth via pattern VA6, which is formed on the third light emitting part LE3, and may extend to the top surface of the substrate 100 along the side surfaces of the third light emitting part LE3, the second light emitting part LE2, and the first light emitting part LE1.

Figure 10A:
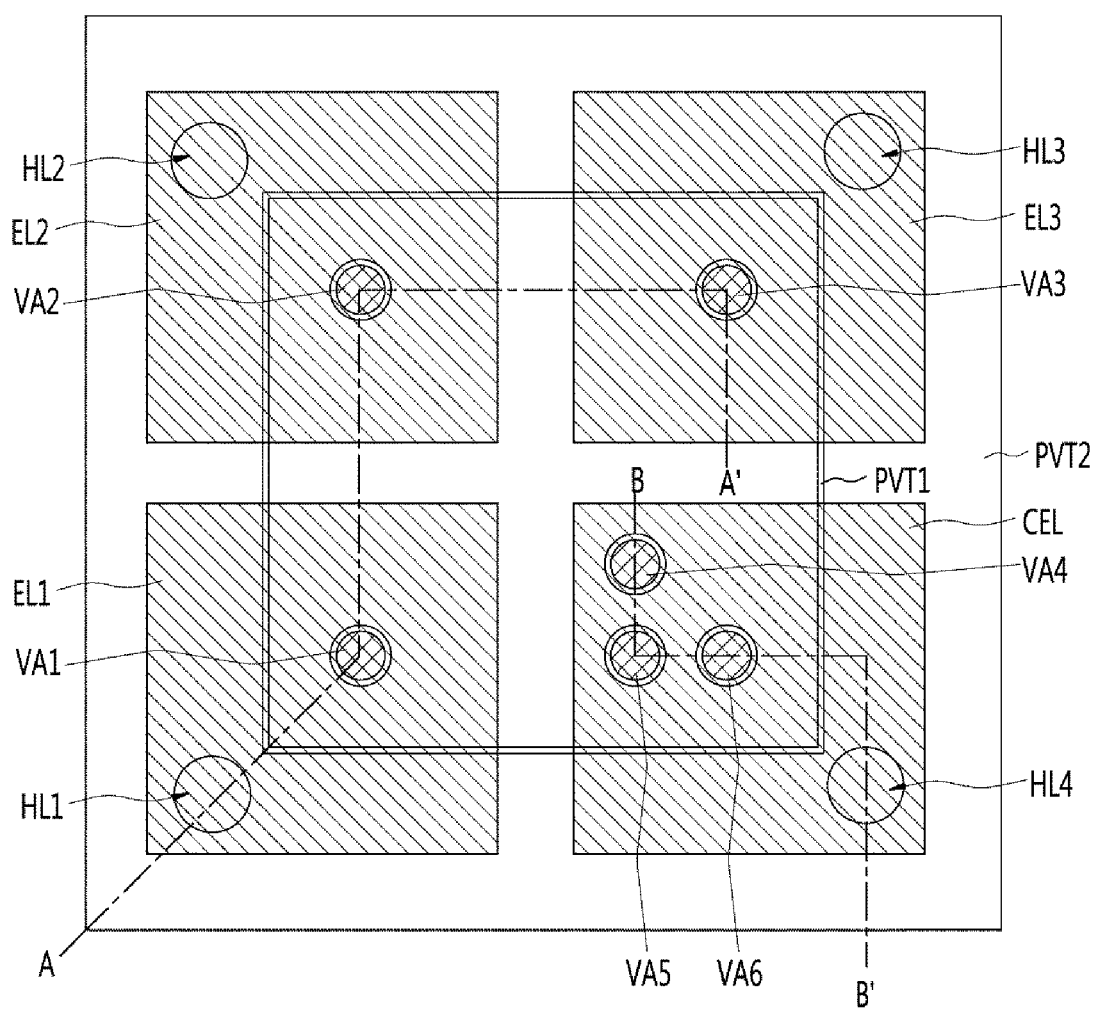
Figure 10B:
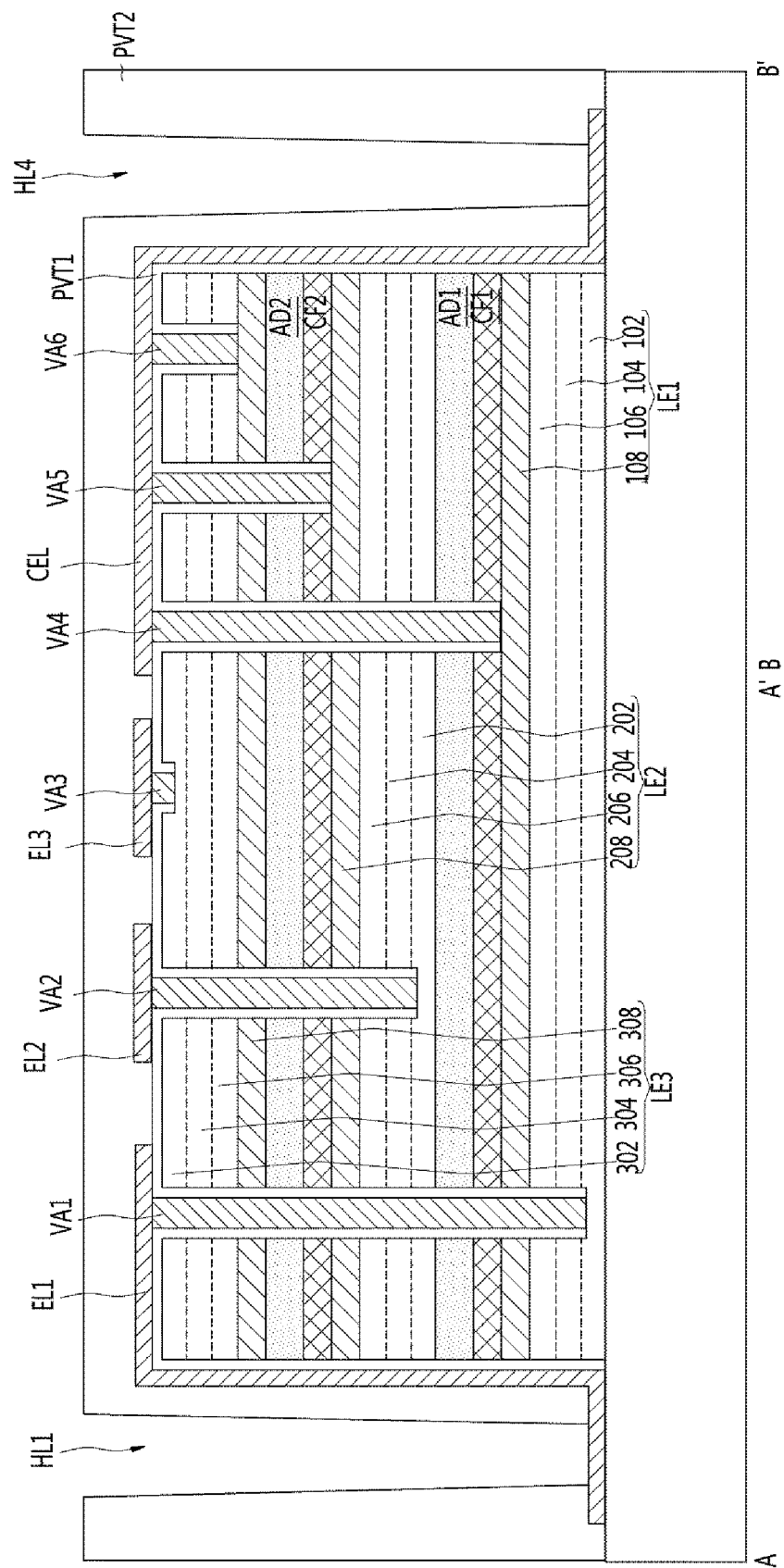

Referring to FIGS. 10A and 10B, a second passivation layer PVT2 may be formed on the substrate 100, which is formed with the first extended pattern EL1, the second extended pattern EL2, the third extended pattern EL3, and the common extended pattern CEL. The second passivation layer PVT2 may be formed between the light emitting devices that are individually separated from one another.

By etching the second passivation layer PVT2, a first hole HL1, a second hole HL2, a third hole HL3, and a fourth hole HL4, which respectively expose portions of the first extended pattern EL1, the second extended pattern EL2, the third extended pattern EL3, and the common extended pattern CEL, may be formed.

The first hole HL1 may expose a portion of the first extended pattern EL1 disposed on the substrate 100, the second hole HL2 may expose a portion of the second extended pattern EL2 disposed on the substrate 100, the third hole HL3 may expose a portion of the third extended pattern EL3 disposed on the substrate 100, and the fourth hole HL4 may expose a portion of the common extended pattern CEL disposed on the substrate 100.

According to an exemplary embodiment, each of the first hole HL1, the second hole HL2, the third hole HL3, and the fourth hole HL4 may have a structure, in which a width thereof gradually decreases toward the substrate 100.

Figure 11A:
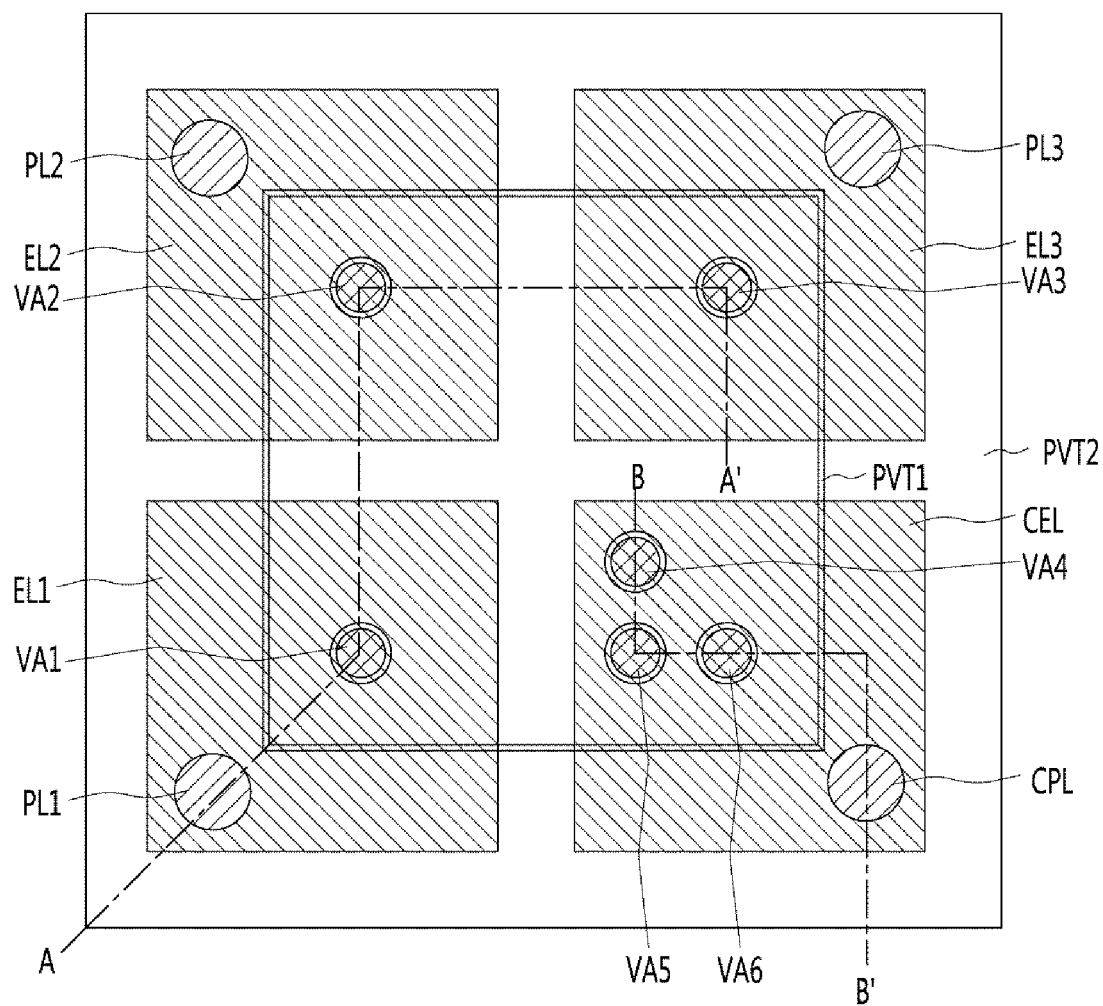
Figure 11B:
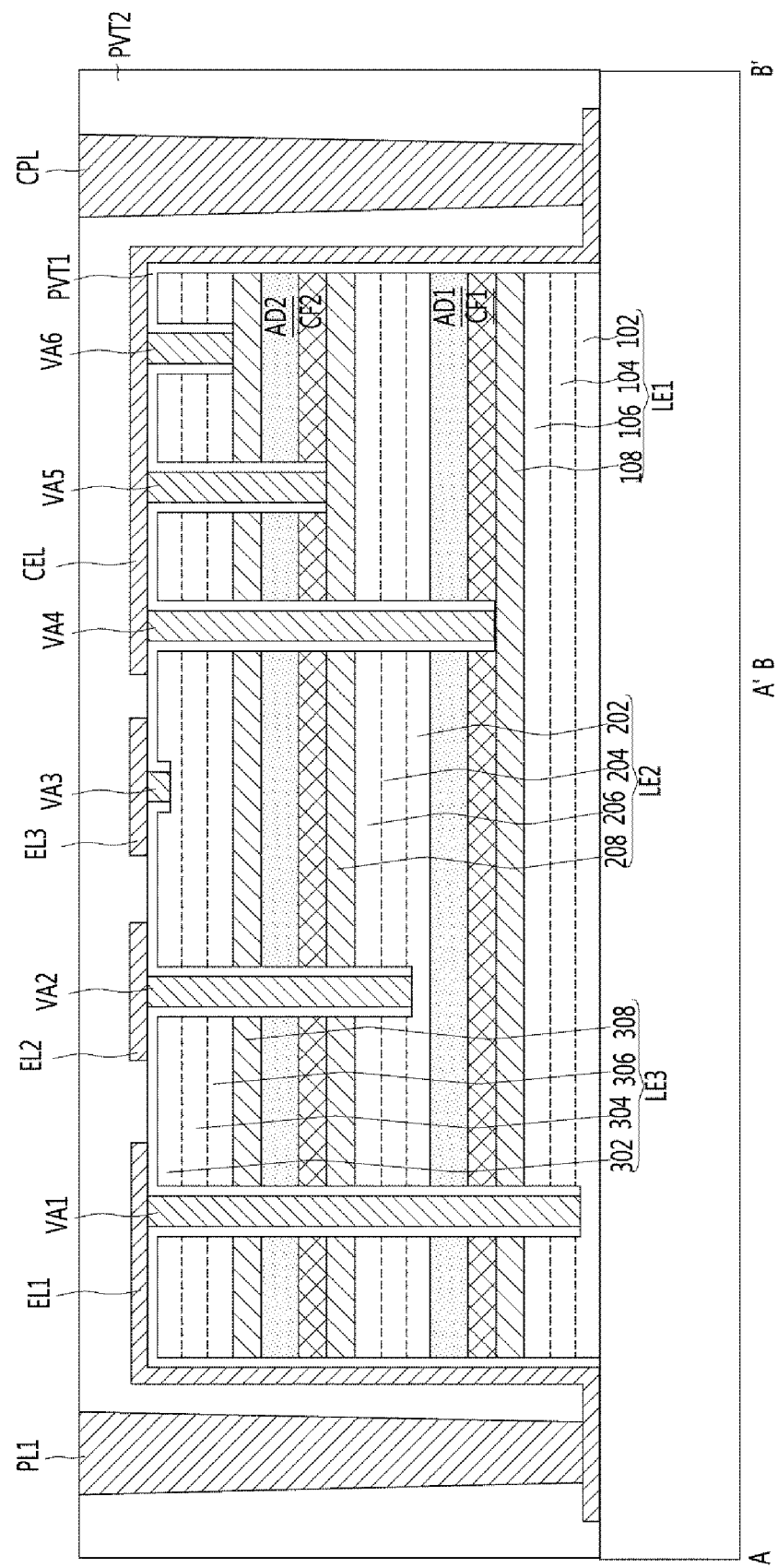

Referring to FIGS. 11A and 11B, a first pillar pattern PL1, a second pillar pattern PL2, a third pillar pattern PL3, and a common pillar pattern CPL, which fill the first hole HL1, the second hole HL2, the third hole HL3 and the fourth hole HL4, respectively, may be formed.

According to an exemplary embodiment, the top surface of each of the first pillar pattern PL1, the second pillar pattern PL2, the third pillar pattern PL3, and the common pillar pattern CPL may be coplanar with the top surface of the second passivation layer PVT2.

Referring back to FIGS. 1A and 1B, a first pad PD1 electrically coupled with the first pillar pattern PL1, a second pad PD2 electrically coupled with the second pillar pattern PL2, a third pad PD3 electrically coupled with the third pillar pattern PL3, and a common pad CPD electrically coupled with the common pillar pattern CPL may be formed.

In the light emitting device according to the exemplary embodiments, pads may be flexibly disposed in the light emitting device having a small critical dimension. In addition, since extended patterns including metal extend along the side surface of the light emitting device, light may be reflected and shielded between adjacent light emitting devices, which may improve the color reproducibility of the light emitting device. Furthermore, by disposing a light shielding layer and defining a light extraction surface, the contrast of the light emitting device may be increased, which may improve a light extraction effect.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
   a substrate having a first region and a second region;
   a light emitting stack including vertically stacked semiconductor layers disposed on the first region of the substrate;
   at least one pillar including a region disposed on the second region of the substrate and laterally spaced apart from the light emitting stack;
   at least one electrode extending from the first region to the second region of the substrate and electrically connecting the light emitting stack to the at least one pillar; and
   a passivation layer covering the light emitting stack and the substrate; and
   a plurality of pads electrically connected to the at least one pillar, respectively wherein the at least one pillar is connected to the at least one electrode, respectively, and
   wherein the passivation layer comprises at least one epoxy resin, epoxy molding compound, or silicone.

2. The light emitting device according to claim 1, wherein the first region is surrounded by the second region.

3. The light emitting device according to claim 1, wherein the at least one electrode covers a side surface of the light emitting stack.

4. The light emitting device according to claim 1, further comprising a passivation layer covering the light emitting stack and the substrate,
   wherein the at least one pillar is surrounded by the passivation layer.

5. The light emitting device according to claim 1, wherein the light emitting stack comprises:
   a first light emitting part disposed on the first region of the substrate;
   a second light emitting part disposed on the first light emitting part; and
   a third light emitting part disposed on the second light emitting part.

6. The light emitting device according to claim 5, further comprising a plurality of vias electrically connected to the first, second, and third light emitting parts,
   wherein the vias are electrically connected to the at least one pillar through the at least one electrode.

7. The light emitting device according to claim 5, wherein each of the first, second, and third light emitting parts includes a first-type semiconductor layer, an active layer, and a second-type semiconductor layer.

8. The light emitting device according to claim 7, wherein the vias comprise:
   a first via passing through the second and third light emitting parts, and electrically coupled with the first-type semiconductor layer of the first light emitting part;
   a second via passing through the third light emitting part, and electrically coupled with the first-type semiconductor layer of the second light emitting part;
   a third via electrically coupled with the first-type semiconductor layer of the third light emitting part;
   a fourth via passing through the second and third light emitting parts, and electrically coupled with the second-type semiconductor layer of the first light emitting part;
   a fifth via passing through the third light emitting part, and electrically coupled with the second-type semiconductor layer of the second light emitting part; and
   a sixth via electrically coupled with the second-type semiconductor layer of the third light emitting part.

9. The light emitting device according to claim 8, further comprising:
   a first pad electrically coupled with the first via;
   a second pad electrically coupled with the second via;
   a third pad electrically coupled with the third via; and
   a common pad electrically coupled in common with the fourth, fifth, and sixth vias,
   wherein the first, second, third, and common pads are disposed on the corresponding pillars, respectively.

10. The light emitting device according to claim 1, further comprising a light shielding layer covering a portion of a surface of the light emitting stack to define a light extraction surface.

11. A light emitting device comprising:
    a substrate having a first region and a second region;
    a light emitting stack including vertically stacked semiconductor layers disposed on the first region of the substrate;
    a plurality of pillars electrically connected to the light emitting stack and including a region disposed on the second region of the substrate; and
    a plurality of electrodes electrically connecting the light emitting stack to the pillars,
    wherein the light emitting stack is spaced apart from the second region of the substrate,
    wherein each of the electrodes extends in a direction from the first region to the second region of the substrate, and
    wherein the plurality of pillars are connected to the plurality of electrodes, respectively.

12. The light emitting device according to claim 11, wherein the passivation layer fills a space between the pillars.

13. The light emitting device according to claim 12, wherein the plurality of pads are disposed on the passivation layer.

14. The light emitting device according to claim 11, wherein the light emitting stack comprises:
    a first light emitting part disposed on the first region of the substrate;
    a second light emitting part disposed on the first light emitting part; and
    a third light emitting part disposed on the second light emitting part.

15. The light emitting device according to claim 14, further comprising:
    a plurality of vias electrically connected to the first, second, and third light emitting parts; and
    a plurality of electrodes extending from the light emitting stack to the pillars, and electrically connecting the vias and the pillars.

16. The light emitting device according to claim 15, wherein:
    each of the first, second, and third light emitting parts includes a first-type semiconductor layer and a second-type semiconductor layer; and the vias comprise:
- a first via passing through the second and third light emitting parts, and electrically coupled with the first-type semiconductor layer of the first light emitting part;
- a second via passing through the third light emitting part, and electrically coupled with the first-type semiconductor layer of the second light emitting part;
- a third via electrically coupled with the first-type semiconductor layer of the third light emitting part;
- a fourth via passing through the second and third light emitting parts, and electrically coupled with the second-type semiconductor layer of the first light emitting part;
- a fifth via passing through the third light emitting part, and electrically coupled with the second-type semiconductor layer of the second light emitting part; and
- a sixth via electrically coupled with the second-type semiconductor layer of the third light emitting part.

17. The light emitting device according to claim 11, further comprising a light shielding layer covering a portion of a surface of the first light emitting part to define a light extraction surface.

18. The light emitting device according to claim 17, further comprising a transparent adhesion part disposed over the light extraction surface.

* * * * *